United States Patent
Yen et al.

(10) Patent No.: US 9,653,531 B2
(45) Date of Patent: May 16, 2017

(54) METHODS OF MANUFACTURING A PACKAGE

(71) Applicant: Taiwan Semiconductor Manufacturing Company, Ltd., Hsin-Chu (TW)

(72) Inventors: Hsiao-Tsung Yen, Tainan (TW); Min-Chie Jeng, Taipei (TW); Hsien-Pin Hu, Zhubei (TW); Tzuan-Horng Liu, Longtan Township (TW); Chin-Wei Kuo, Zhubei (TW); Chung-Yu Lu, Hsin-Chu (TW); Yu-Ling Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 13 days.

(21) Appl. No.: 14/514,212

(22) Filed: Oct. 14, 2014

(65) Prior Publication Data
US 2015/0031184 A1    Jan. 29, 2015

Related U.S. Application Data

(62) Division of application No. 13/747,861, filed on Jan. 23, 2013, now Pat. No. 8,896,094.

(51) Int. Cl.
*H01L 49/02* (2006.01)
*H01L 23/64* (2006.01)
(Continued)

(52) U.S. Cl.
CPC ........ *H01L 28/10* (2013.01); *H01L 21/76885* (2013.01); *H01L 23/49822* (2013.01); *H01L 23/5227* (2013.01); *H01L 23/645* (2013.01); *H01L 25/0657* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 2224/13082* (2013.01); *H01L 2224/13111* (2013.01); *H01L 2224/13139* (2013.01); *H01L 2224/13147* (2013.01); *H01L 2224/16145* (2013.01); *H01L 2224/16225* (2013.01); *H01L 2224/81192* (2013.01); *H01L 2224/81801* (2013.01); *H01L 2224/83192* (2013.01);
(Continued)

(58) Field of Classification Search
None
See application file for complete search history.

(56) References Cited

U.S. PATENT DOCUMENTS 5,477,086 A  * 12/1995  Rostoker ........... H01L 23/49811
                                                        257/673
6,614,325 B1    9/2003  Kocin
(Continued)

*Primary Examiner* — Matthew Reames
*Assistant Examiner* — Steven B Gauthier
(74) *Attorney, Agent, or Firm* — Slater Matsil, LLP

(57) ABSTRACT

A method of manufacturing a package may include: providing a first device having a first redistribution layer (RDL) and an insulator layer disposed over the first RDL; and forming a first micro-bump line over the insulator layer of the first device. The first micro-bump line may extend laterally over a surface of the insulator layer facing away from the first RDL, and a first inductor of the package comprises the first RDL and the first micro-bump line.

20 Claims, 25 Drawing Sheets

(51) Int. Cl.
  *H01L 23/498* (2006.01)
  *H01L 23/522* (2006.01)
  *H01L 21/768* (2006.01)
  *H01L 25/065* (2006.01)
  *H01L 23/00* (2006.01)

(52) U.S. Cl.
  CPC .............. *H01L 2224/83862* (2013.01); *H01L 2225/06513* (2013.01); *H01L 2225/06527* (2013.01); *H01L 2924/1206* (2013.01); *H01L 2924/19042* (2013.01)

(56) References Cited

U.S. PATENT DOCUMENTS

| | | |
|---|---|---|
| 7,145,411 B1 | 12/2006 | Blair et al. |
| 8,358,009 B2 | 1/2013 | Furumiya et al. |
| 8,610,247 B2 | 12/2013 | Yen et al. |
| 2004/0155728 A1 | 8/2004 | Cheung et al. |
| 2006/0157845 A1 | 7/2006 | Terui |
| 2007/0241844 A1 | 10/2007 | Kim et al. |
| 2008/0029886 A1 | 2/2008 | Cotte et al. |
| 2009/0249610 A1 | 10/2009 | Ding et al. |
| 2010/0246152 A1 | 9/2010 | Lin et al. |
| 2011/0210444 A1* | 9/2011 | Jeng ............... H01L 23/13 257/738 |
| 2011/0285007 A1 | 11/2011 | Chi et al. |
| 2011/0291232 A1* | 12/2011 | Yen ............ H01L 23/49822 257/531 |
| 2012/0175771 A1 | 7/2012 | Huang et al. |
| 2013/0001795 A1 | 1/2013 | Lim et al. |
| 2013/0168809 A1 | 7/2013 | Yen et al. |
| 2013/0187266 A1* | 7/2013 | Chen ............. H01L 25/0657 257/737 |
| 2013/0336082 A1 | 12/2013 | Khawshe et al. |
| 2014/0008773 A1 | 1/2014 | Yen et al. |
| 2014/0054802 A1 | 2/2014 | Shim et al. |
| 2014/0070404 A1 | 3/2014 | Sheu et al. |
| 2014/0084415 A1 | 3/2014 | Lin et al. |
| 2014/0097930 A1 | 4/2014 | Yen et al. |
| 2014/0203397 A1 | 7/2014 | Yen et al. |
| 2014/0252548 A1 | 9/2014 | Yen |

* cited by examiner

METHODS OF MANUFACTURING A PACKAGE

This application is a divisional of U.S. patent application Ser. No. 13/747,861, entitled "Methods and Apparatus for Inductors and Transformers in Packages," filed on Jan. 23, 2013, which application is hereby incorporated herein by reference.

BACKGROUND

Electronics can be divided into a simple hierarchy consisting of devices such as integrated circuit (IC) chips, packages, printed circuit boards (PCB), and systems. The package is the interface between an IC chip and a PCB. IC dies are made from semiconductor materials such as silicon. Dies are then assembled into packages such as quad flat packs (QFP), pin grid arrays (PGA), ball grid arrays (BGA), three dimensional integrated circuits (3DIC), wafer level packages (WLP), or package on package (PoP) devices, using wire bonding (WB), tape automated bonding (TAB), or flip chip (FC) bumping assembly techniques. The packaged die is then attached either directly to a PCB or to another substrate as the second level packaging.

3DIC technologies are known as vertical interconnect packaging technologies as they exploit the vertical dimension of the chip to reduce interconnect length and to achieve greater integration efficiency. The techniques for 3DIC package include wire-bonding, micro-bumps, through-vias, and more. A silicon interposer can be used to form a 3DIC package, where the interposer provides die-to-die interconnections for dies mounted on the interposer. For example, two dies may be bonded above each other by face-to-face or face-to-back stacking, with the lower die being coupled to the interposer by connectors such as micro-bumps. Alternatively, multiple dies may also be mounted in parallel above an interposer, and coupled to the interposer by connectors such as micro-bumps.

An inductor is a passive electrical component that stores energy in its magnetic field. Inductors are used extensively in analog circuits, signal processing systems, and wireless communication systems. Inductors in conjunction with capacitors and other components form circuits which can filter out specific signal frequencies. A transformer is a power converter that transfers electrical energy from one circuit to another. Two or more inductors with coupled magnetic flux form a transformer.

Performance of inductors and transformers formed on an IC chip may be increasingly limited by the shrinking device sizes, such as the shrinking thickness between metal layers of the chip, and the smaller areas occupied by the chip. Methods and apparatus are needed for inductors and transformers to improve the performance.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1(a)-1 through 1(a)-10 are cross-sectional views illustrating various intermediate stages of forming the structure in FIG. 1(a), in accordance with some embodiments;

FIGS. 4, 5, and 6 illustrate process flows of methods of manufacturing packages, in accordance with some embodiments.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION

Figure 1A:
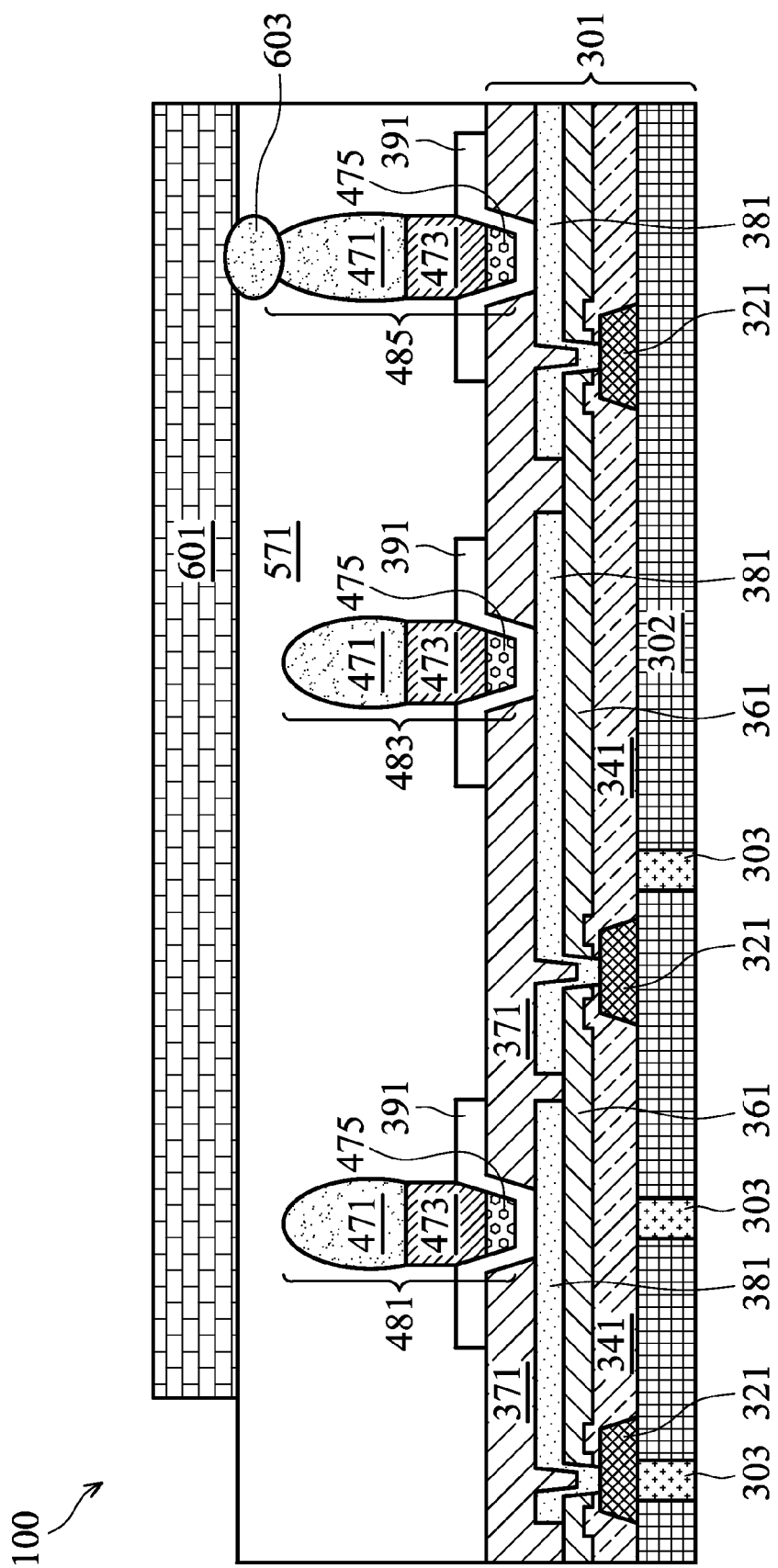
FIGS. 1(a)-1(d) illustrate cross-sectional views and a top view of inductors formed within a package using a micro-bump layer, in accordance with some embodiments.

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

As will be illustrated in the following, methods and apparatus for forming a semiconductor device package with inductors and transformers using a micro-bump layer are disclosed. The micro-bump layer may comprise micro-bumps and micro-bump lines, formed between a top die and a bottom die, or between a die and an interposer. An inductor can be formed by a redistribution layer (RDL) within a bottom device and a micro-bump line above the bottom device connected to the RDL. The inductor may be a symmetric inductor, a spiral inductor, a helical inductor which is a vertical structure, or a meander inductor. Compared to metal lines within a chip, the micro-bump lines are wider with larger area and lower resistances, therefore inductors formed with micro-bump lines have higher performance. It saves cost as well. A pair of inductors with micro-bump lines can form a transformer.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

As illustrated in FIG. 1(a), a semiconductor device package 100 comprising an inductor may be formed on a device 301. The device 301 may comprise: a substrate 302 with through vias (TV) 303, a plurality of contact pads 321, a passivation layer 341, an insulator layer 361, a redistribution layer (RDL) 381, another insulator layer 371, and an under bump metal (UBM) layer comprising UBM pads 391 covering openings of the insulator layer 371. A micro-bump layer may be formed above the device 301. The micro-bump layer comprises micro-bump lines 481 and 483, placed on the UBM pads 391, which are further connected to the RDL 381 inside the device 301. The RDL 381, the micro-bump lines 481 and 483, and the UBM pads 391 under the micro-bump lines 481 and 483 are parts of the inductor 200 shown in FIG. 1(b) in a top view. The micro-bump layer may comprise additional micro-bumps 485. A die 601 may be placed above the device 301, connected to the micro-bump 485 by connectors 603. An underfill 571 may fill the gap between the device 301 and the die 601, covering the micro-bump lines 481 and 483, the micro-bump 485, and connectors 603. Each of these structures is discussed in greater detail in the following paragraphs.

The device 301 may be an interposer comprising a substrate, with through vias formed within the substrate, and a plurality of contact pads, passivation layers, insulator layers, RDLs, and a UBM layer. Alternatively, the device 301 may be a part of a chip or an integrated circuit (IC) die, which may be a back or front side of a die. When the device 301 is a part of a die, the die 601 is placed on the IC device 301, which will be further coupled to an interposer by connectors such as micro-bumps to form a package such as a 3DIC package. In the case when the device 301 is a part of a die, it may be called as a bottom die, and the die 601 may be called a top die. When the device 301 is the back of a die, then the package 100 is formed by face-to-back stacking of the dies 301 and 601. When the device 301 is the front side of a die, then the package 100 is formed by face-to-face stacking of the dies 301 and 601. Alternatively, the device 301 may be a package substrate without through vias, any or all of the layers described above. These devices and any other suitable devices may alternatively be used and are fully intended to be included within the scope of the present embodiments.

The substrate 302 for the device 301 may be, e.g., a silicon substrate, doped or undoped, or an active layer of a silicon-on-insulator (SOI) substrate, used to provide support for the device 301. However, the substrate 302 may alternatively be a glass substrate, a ceramic substrate, a polymer substrate, or any other substrate that may provide a suitable protection and/or interconnection functionality. These and any other suitable materials may alternatively be used for the substrate 302. There may be a plurality of active or passive components, such as transistors, capacitors, resistors, and the like, formed within the substrate 302, which are not shown in FIG. 1(a). As one of ordinary skill in the art will recognize, a wide variety of active or passive components may be used to generate the desired structural and functional requirements of the design for the device 301.

Figures 1, 1A:
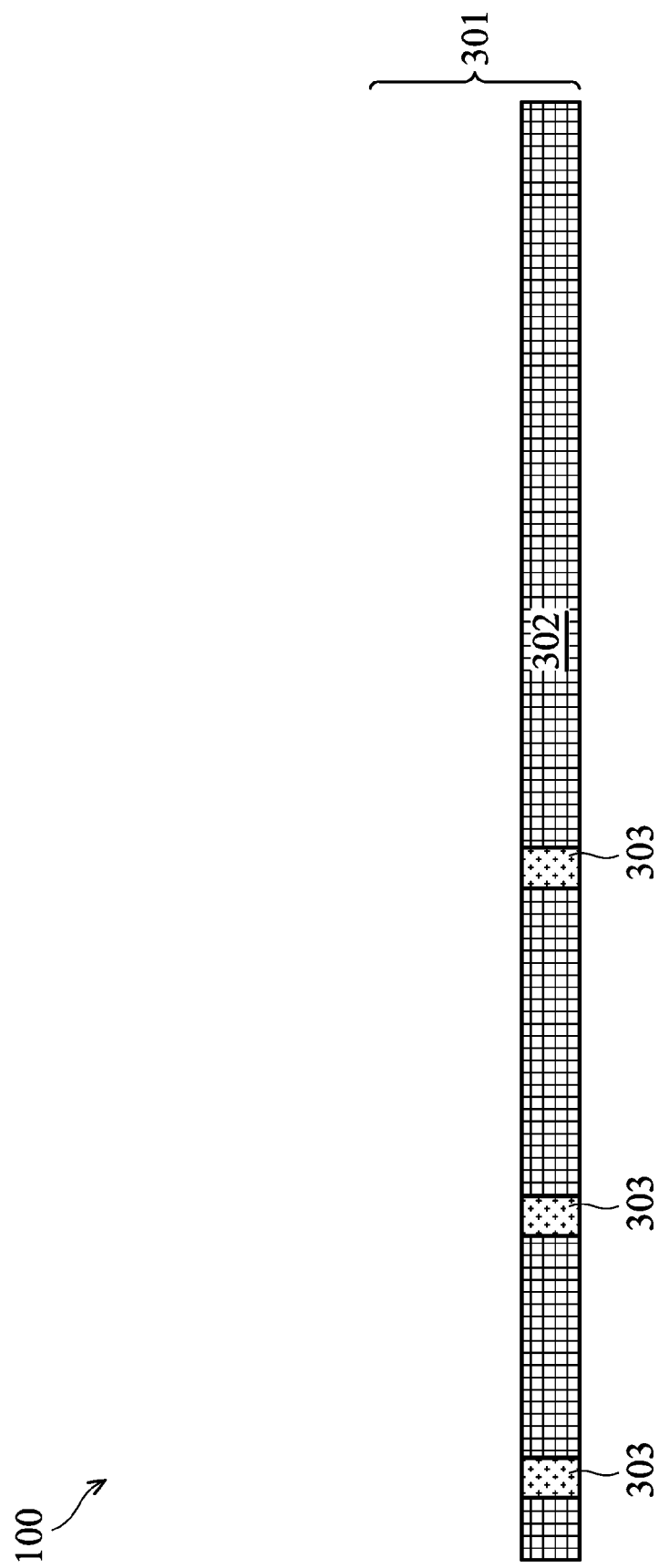

A plurality of TVs 303 may be formed through the substrate 302 (see FIG. 1(a)-1). The TVs 303 may be formed by applying and developing a suitable photoresist, and then etching the substrate 302 to generate TV openings. The openings for the TVs 303 may be formed to extend into the substrate 302 to a depth at least greater than the eventual desired height. Accordingly, the depth may be between about 1 μm and about 700 μm below the surface on the substrate 302. The openings for the TVs 303 may have a diameter of between about 0.5 μm and about 100 μm. Then the openings for the TVs 303 may be filled by a barrier layer and a conductive material, using a process such as chemical vapor deposition (CVD) process, plasma enhanced CVD (PECVD), sputtering or metal organic chemical vapor deposition (MOCVD). Excessive barrier layer and excessive conductive material outside of the openings for the TVs 303 may be removed through a grinding process such as chemical mechanical polishing (CMP). Afterwards, a thinning of the second side of the substrate 302 may be performed by a planarization process such as CMP or etching, in order to expose the openings for the TVs 303 and to form the TVs 303 from the conductive material that extends through the substrate 302.

Figures 1, 1A, 2:
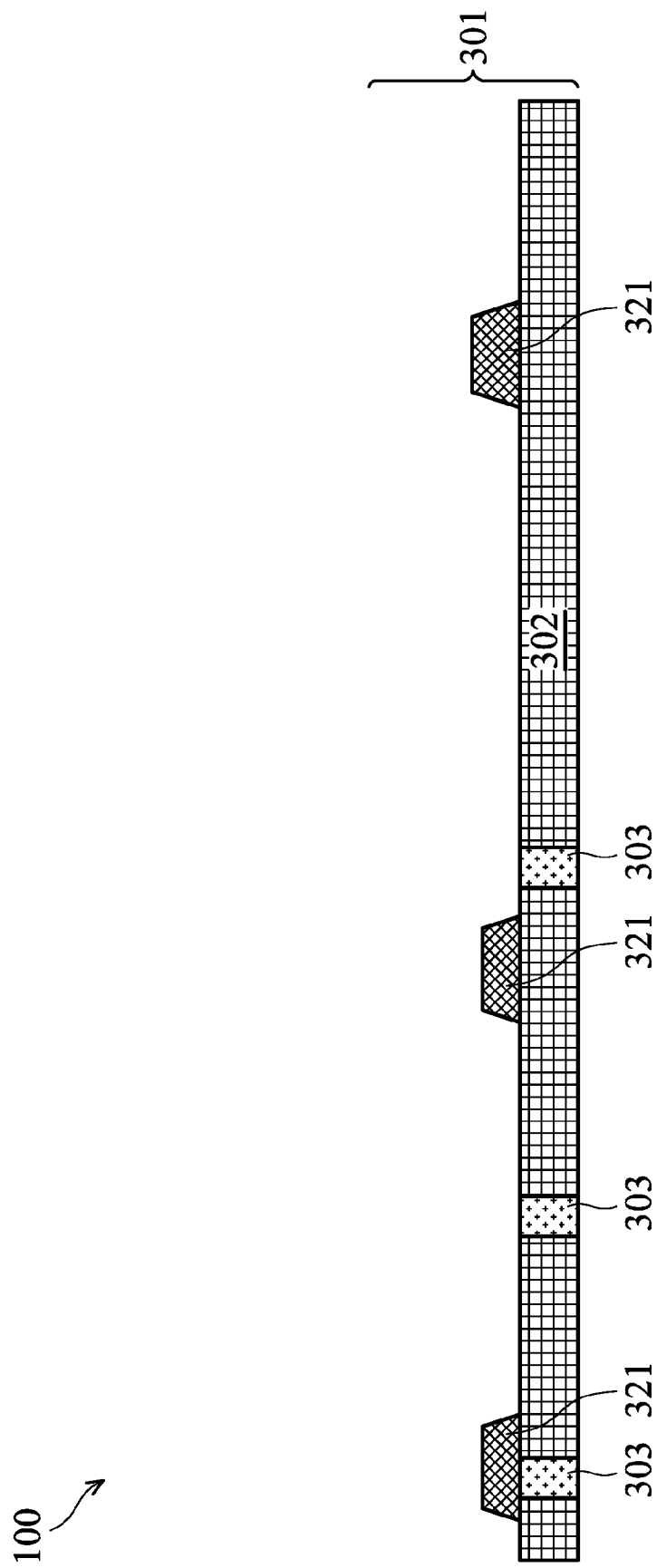
Figures 1, 1A, 2, 3:
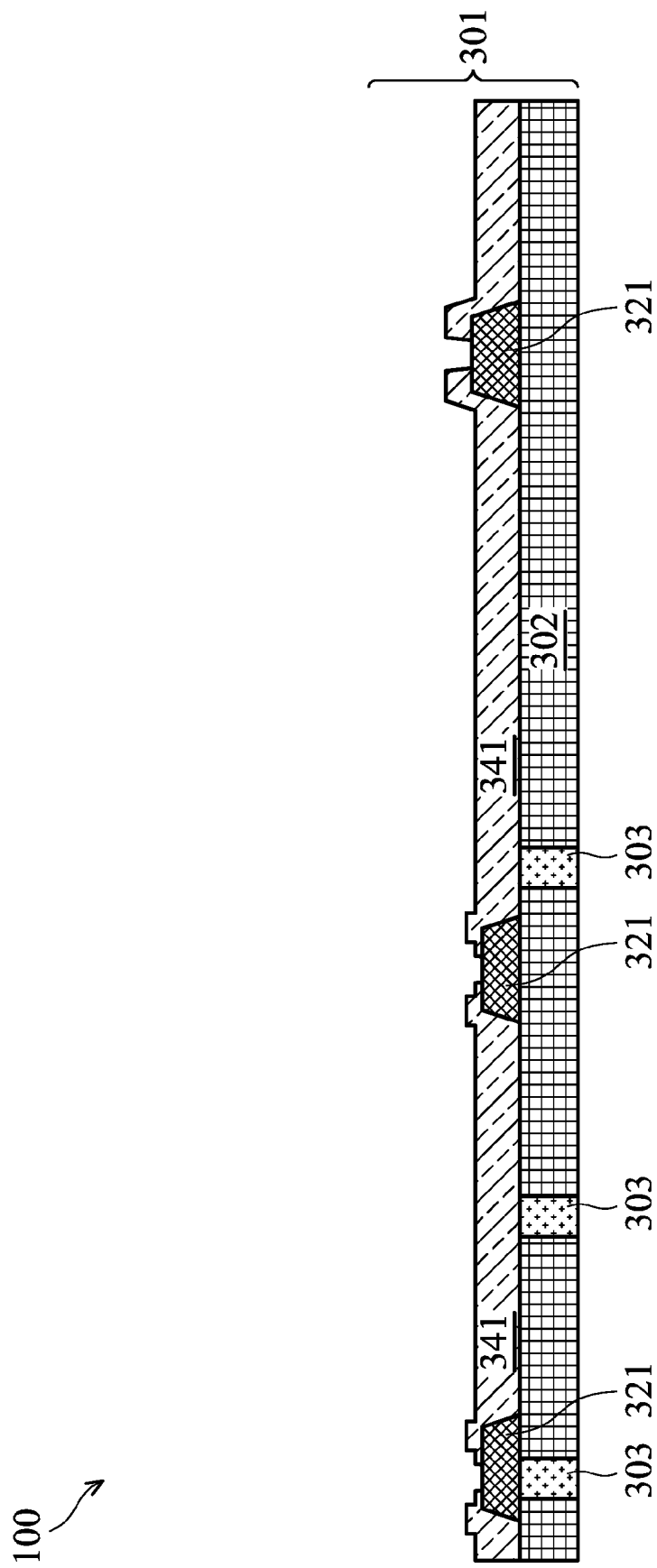

A plurality of contact pads 321 may be formed on the substrate 302 (see FIG. 1(a)-2). Contact pads 321 may be made with aluminum (Al), copper (Cu), tin (Sn), nickel (Ni), gold (Au), silver (Ag), or other electrically conductive material. The deposition of contact pads 321 uses an electrolytic plating, sputtering, physical vapor deposition (PVD), or electroless plating process. The size, shape, and location of the contact pads 321 are only for illustration purposes and are not limiting. The plurality of contact pads 321 may be of the same size or of different sizes.

A passivation layer 341 may be formed over the surface of the substrate 302 and above the contact pads 321 for structural support and physical isolation (see FIG. 1(a)-3). The passivation layer 341 may be made with silicon nitride (SiN), silicon dioxide ($SiO_2$), silicon oxynitride (SiON), polyimide (PI), benzocyclobutene (BCB), polybenzoxazole (PBO), or other insulating material. Openings of the passivation layer 341 may be made by removing a portion of the passivation layer 341 using a mask-defined photoresist etching process to expose the contact pads 321. The size, shape, and location of the openings made are only for illustration purposes and are not limiting.

An insulator layer 361, such as a polymer layer 361, may be formed over the passivation layer 341 and over the passivation layer opening to cover the contact pads 321 (see FIG. 1(a)-4). An opening of the insulator layer 361 may be formed to expose the contact pads 321. The openings of the insulator layer 361 may be made by removing a portion of the insulator layer 361 using a mask-defined photoresist etching process to expose the contact pads 321. The size, shape, and location of the opening made are only for illustration purposes and are not limiting.

A RDL 381 may be formed following the contour of the insulator layer 361 (see FIG. 1(a)-5). The RDL 381 may be continuous and cover the exposed contact pads 321. While illustrated in FIG. 1(a) as a single layer of dielectric and interconnects, the RDL 381 may be formed of alternating layers of dielectric and conductive material and may be formed through any suitable process (such as deposition, damascene, dual damascene, etc.). The RDL 381 may be made with, e.g., Al, Cu, or a Cu alloy. The RDL 381 can be made by an electrolytic plating, sputter, PVD, or electroless plating process. The RDL 381 can be made with a single layer, or multiple layers using an adhesion layer of Ti, TiW, TaN, Ta or Cr, for example. The device 301 may comprise a number of RDL layers to form a network of inter-level interconnects which may electrically connect to the contact pads 321 according to the function of the semiconductor device.

Another insulator layer 371 may be formed on the RDL 381, which may be the top layer and surface layer of the device 301 (see FIG. 1(a)-6). Openings of the insulator layer 371 may be formed to expose the RDL 381. The openings of the insulator layer 37 may be made by removing a portion of the insulator layer 371 using a mask-defined photoresist etching process to expose the RDL 381. The size, shape, and location of the opening made are only for illustration purposes and are not limiting. The insulator layer 371 may be formed of a polymer, such as an epoxy, polyimide, benzocyclobutene (BCB), polybenzoxazole (PBO), and the like, although other relatively soft, often organic, dielectric materials can also be used. Formation methods include spin coating or other commonly used methods. The thickness of the insulator layer 371 may be between about 5 μm and about 30 μm, for example. The dimensions recited throughout the description are merely examples, and will change with the down-scaling of integrated circuits.

An UBM layer comprising UBM pads 391 may be formed around the openings of the insulator layer 371 and connected to the RDL 381 (see FIG. 1(a)-7). The UBM pads 391 may be formed of copper or copper alloys, which may include silver, chromium, nickel, tin, gold, and combinations thereof. Additional layers, such as a nickel layer, a lead-free pre-solder layer, or the combinations thereof, may be formed over the copper layer. The UBM pads 391 may have a thickness of between about 1 μm and about 20 μm. The UBM pads 391 may be called contact pads as well.

The device 301 described above may merely be an example of an embodiment. There may be many other variations different from what is illustrated in FIG. 1(a) and described above. For example, the insulator layer 361 may not present in some of the embodiments, or there may be multiple passivation layers 341 in some embodiments. The device 301 may have only a RDL contained in an insulator layer.

The die 601 may be packaged with the device 301 through a micro-bump layer, while the gap between the die 601 and the device 301 is covered by an underfill 571. The die 601 is connected to the connectors 603, which are placed on the micro-bump 485 within the micro-bump layer.

Connectors 603 may be used to provide connections between the micro-bump 485 and the die 601 (see FIG. 1(a)-9). The connectors 603 may be contact bumps such as micro-bumps or controlled collapse chip connection (C4) bumps and may comprise a material such as tin, or other suitable materials, such as silver or copper. In an embodiment in which the connectors 603 are tin solder bumps, the connectors 603 may be formed by initially forming a layer of tin through any suitable method such as evaporation, electroplating, printing, solder transfer, ball placement, etc., to a preferred thickness of 20 μm to 200 μm, such as about 100 μm. Once a layer of tin has been formed above the structure, a reflow may be performed in order to shape the material into the desired bump shape.

The underfill 571 may be used between the die 601 and the device 301 to strengthen the attachment of the die 601 to the device 301 and to prevent the thermal stresses from breaking the connections between the die 601 and the device 301 (see FIG. 1(a)-10). Generally, the material for the underfill 571, such as organic resin, is selected to control the coefficient of thermal expansion and the shrinkage of underfill 571. Initially, liquid organic resin is applied that flows into the gap between the die 601 and the surface of the device 301, which subsequently cures to control the shrinkage that occurs in underfill during curing.

The micro-bump layer may comprise a micro-bump 485, micro-bump lines 481 and 483, where the micro-bump 485 is used to connect to other die such as the die 601, and the micro-bump lines 481 and 483 are parts of an inductor (see FIG. 1(a)-8). The micro-bump lines 481 and 483, and the micro-bump 485 may be formed at the same time with little or no additional cost, may be of a similar height, and may be made of similar materials. The height of the micro-bump layer may be defined by the height of the micro-bump 485, which may depend on the technology used in the package. For example, for current technology, the height of the micro-bump layer may be within the range of about 10 μm to about 50 μm, such as about 27 μm.

The micro-bump 485 may comprise a solder bump 471 formed above a Cu layer 475. An optional Ni layer 473 may be in between the solder bump 471 and the Cu layer 475. The solder bump 471 may comprise an electrically conductive solder material, e.g., Sn, Ni, Au, Ag, Cu, bismuthinite (Bi) and alloys thereof, or combinations of other electrically conductive material. For example, the solder bump 471 may be a Cu/SnAg solder bump. The micro-bump 485 may be formed by initially forming a Cu layer 475 through methods such as sputtering, evaporation, electroplating, printing, solder transfer, or ball placement, to a thickness of, e.g., about 15 μm, followed by forming a Ni layer 473, and finally followed by forming a solder layer 471 such as lead-free solder SnAg, formed in sequence using the same or similar method for each layer. Then a reflow is performed in order to shape the solder layer 471 into the desired bump shape shown as the solder bump 471. Any suitable method of producing the micro-bump 485 may alternatively be utilized. For example, the micro-bump 485 may be manufactured using the Controlled Collapse Chip Connection New Process (C4NP).

The micro-bump 485 may be placed on an UBM pad 391 of the device 301, sometimes referred to herein as a contact pad. The UBM pad 391 may fill an opening or partially filling an opening of an insulator layer such as a polymer layer 371. The UBM pad 391 may be further connected to a metal layer such as a RDL 381 or a contact pad 321 under the UBM pad 391 within the device 301. The micro-bump 485 may be of a height size from about 10 µm to about 50 µm. With the continuous reduction of feature sizes and package sizes, the sizes in embodiments may become smaller than the ones described above. On the other hand, the micro-bump 485 may be of a bigger size such as a size of a flip-chip bump or a package bump as well, depending on the particular applications of interest.

The micro-bump lines 481 and 483 may be made of substantially similar materials as the materials used for the micro-bump 485. The micro-bump lines 481 and 483 may be placed on UBM pads 391 of the device 301, which are further connected to the RDLs 381 and contact pads 321 under the UBM pads 391 within the device 301. The RDLs 381, the micro-bump lines 481 and 483, and the UBM pads 391 under the micro-bump lines 481 and 483 are parts of the inductor 200 shown in FIG. 1(b) in a top view. As shown in FIG. 1(b), the inductor 200 is a one-turn symmetric inductor having two input ports 202 and 204. The inductor 200 can be split by a symmetry line 206 such that a first half, comprising the micro-bump line 481, of the inductor 200 on one side of the symmetry line 206 has the same dimensions as a second half of the inductor 200 on the other side of the symmetry line 206, comprising the micro-bump line 483.

As illustrated in FIG. 1(a), the micro-bump lines 481 and 483 may comprise multiple layers: the layer 475 above the UBM pad 391 may be a layer of Cu, the layer 473 above the layer 475 may be a layer of Ni, and the layer 471 above the layer 473 may be a layer of lead free solder such as SnAg. On the other hand, the micro-bump lines 481 and 483 may be of two layers only, the layer 475 above the UBM pad 391 may be a layer of Cu, and the layer 471 may be a layer of lead free solder such as SnAg, without the layer 473 of Ni. The layer 471 may be a lead free solder layer made of SnAg, with Ag from about 1% to about 2%, and Sn from about 99% to about 98%. The height of the three layers 471, 473, and 475 may be about the same, or different, which can be varied according to different requirement. For example, a ratio of the heights for the layers 475 of Cu, 473 of Ni, and 471 of lead free solder may be around 15/1.5/10, The total height of the micro-bump lines 481 and 483 may be within a range from about 10 µm to about 50 µm, e.g., 27 µm.

The micro-bump lines 481 and 483 may be of a rectangle shape with a width from around 10 µm to about 100 µm. The width of the micro-bump lines 481 and 483 may be about the same. The micro-bump lines 481 and 483 may have a narrow, wide, or tapered shape. The body of the micro-bump lines 481 and 483 may be of a substantially constant thickness. The micro-bump lines 481 and 483 may be of other shapes such as a circle, an octagon, a rectangle, an elongated hexagon with two trapezoids on opposite ends of the elongated hexagon, an oval, a diamond, in top views.

Figures 1, 1A, 2, 3, 4:
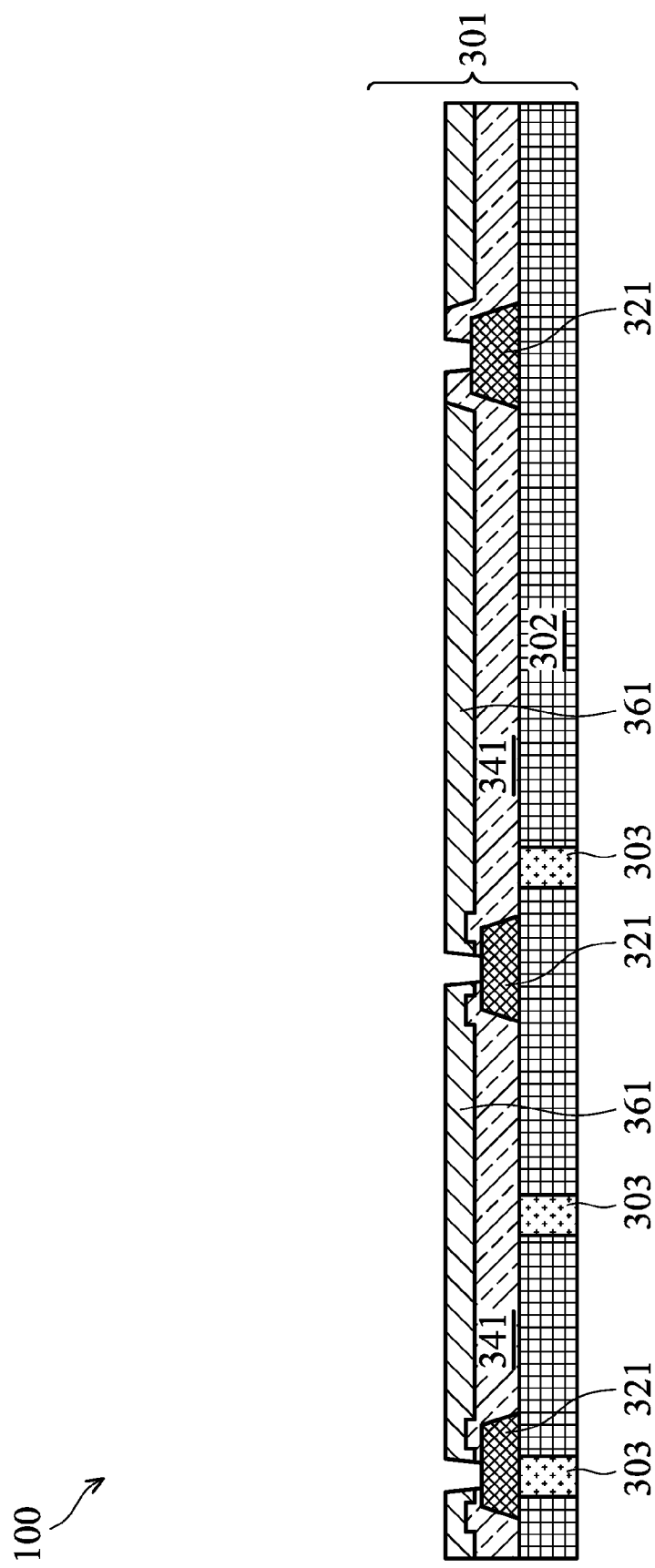
Figures 1, 1A, 2, 3, 4, 5:
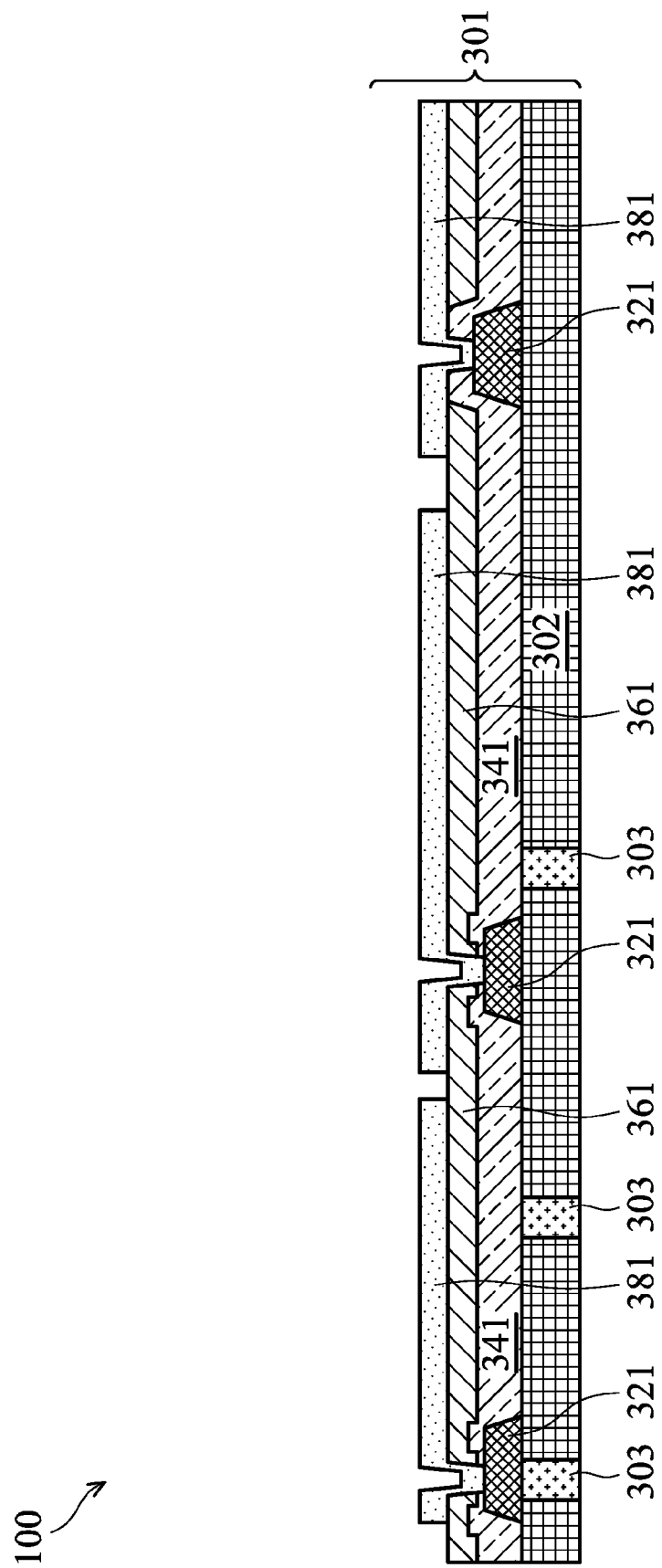
Figures 1, 1A, 2, 3, 4, 5, 6:
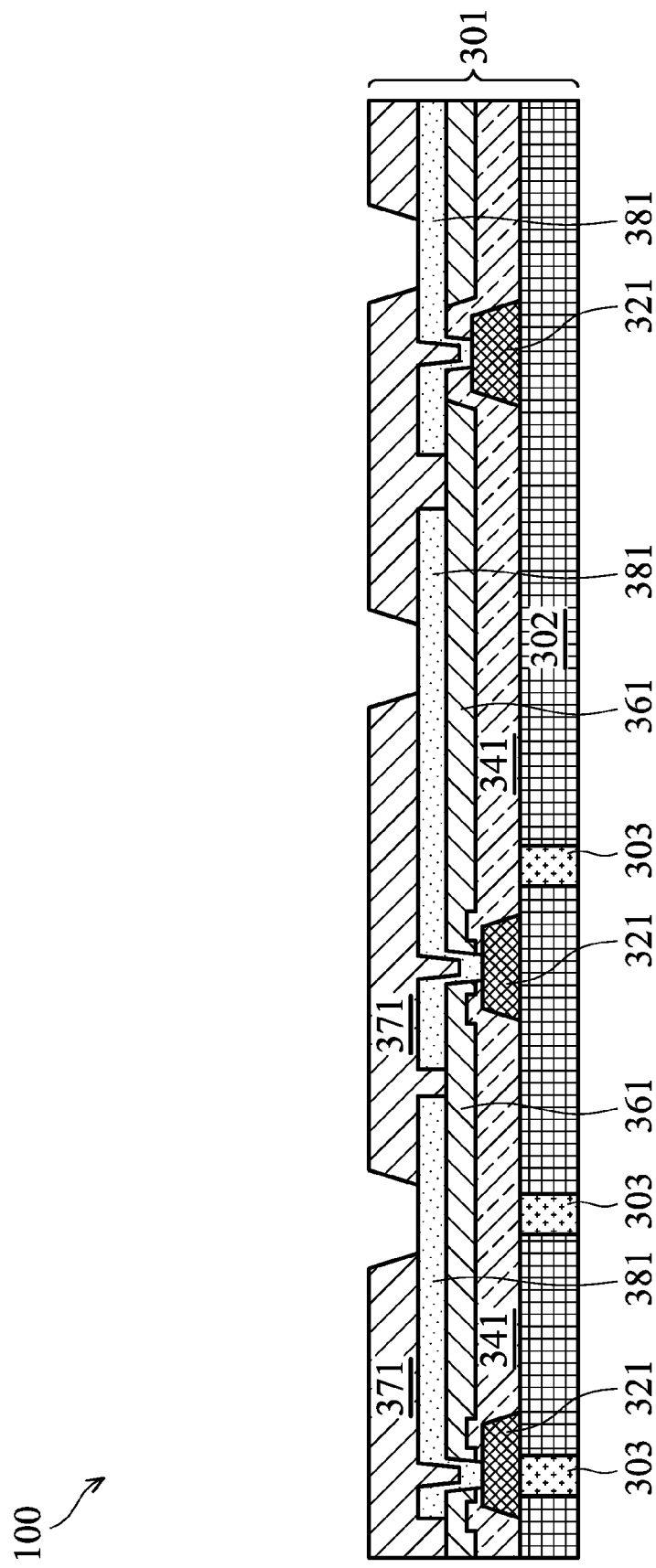
Figures 1, 1A, 2, 3, 4, 5, 6, 7:
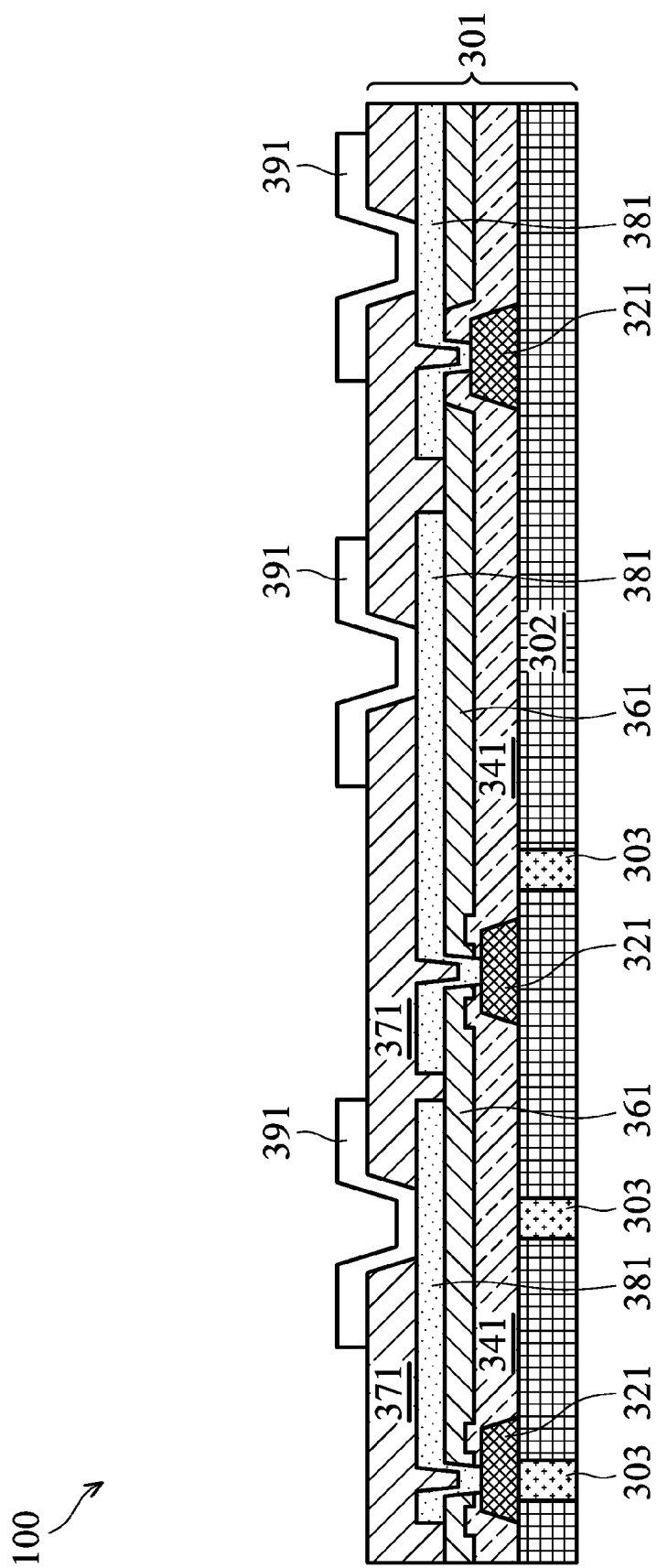
Figures 1, 1A, 2, 3, 4, 5, 6, 7, 8:
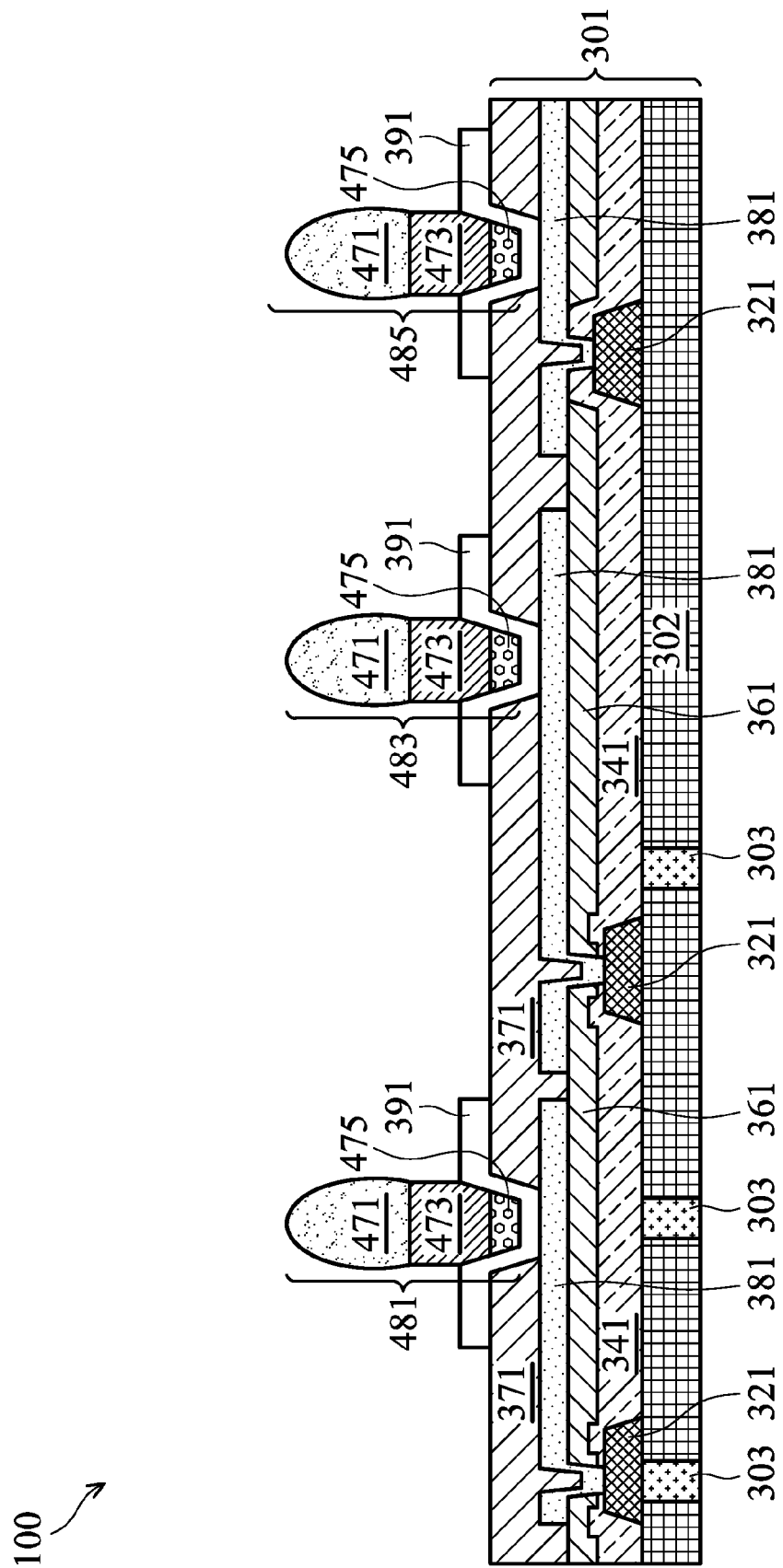
Figures 1, 1A, 2, 3, 4, 5, 6, 7, 8, 9:
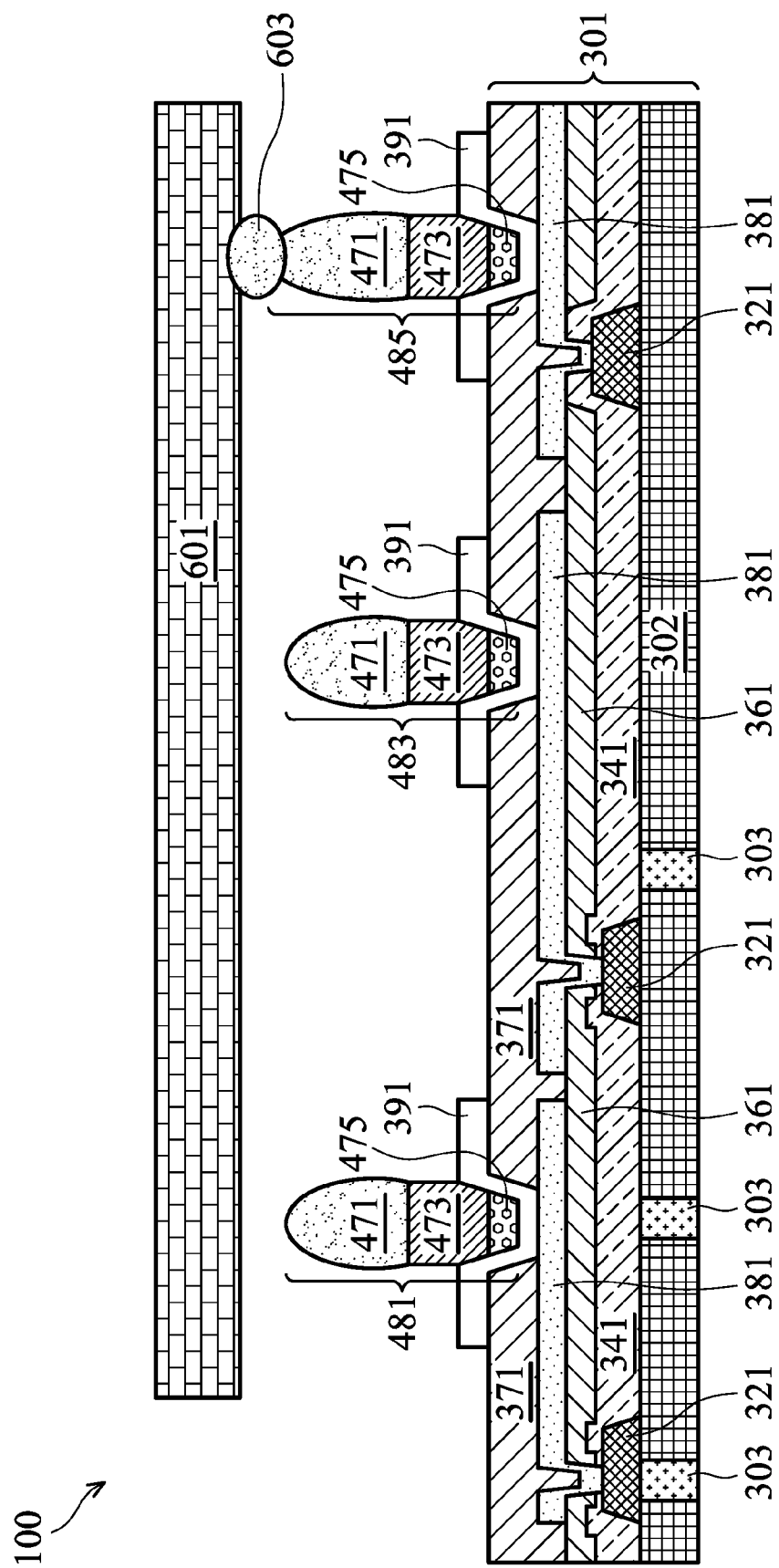
Figures 1, 1A, 2, 3, 4, 5, 6, 7, 8, 9, 10:
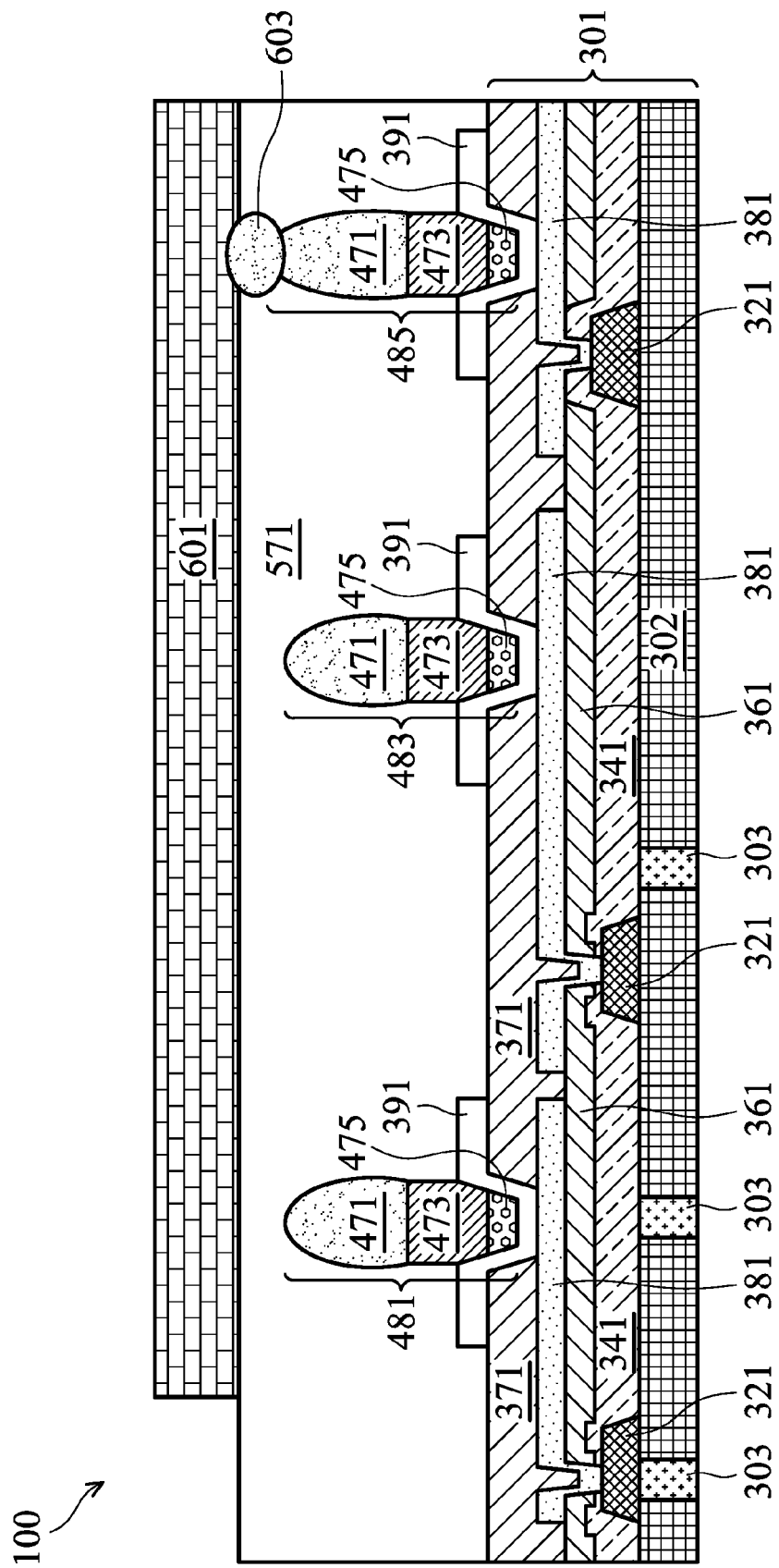
Figure 1B:
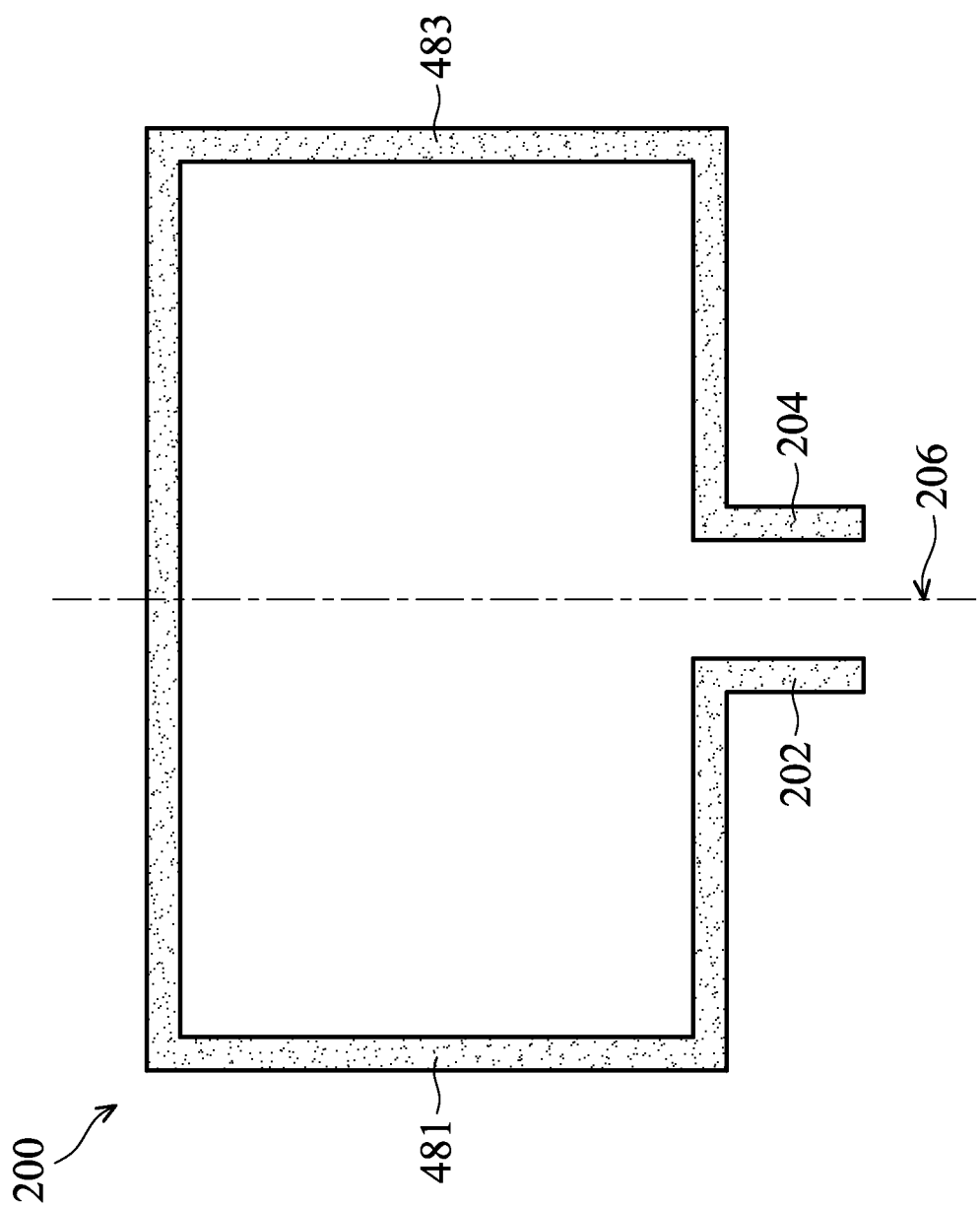
Figure 1C:
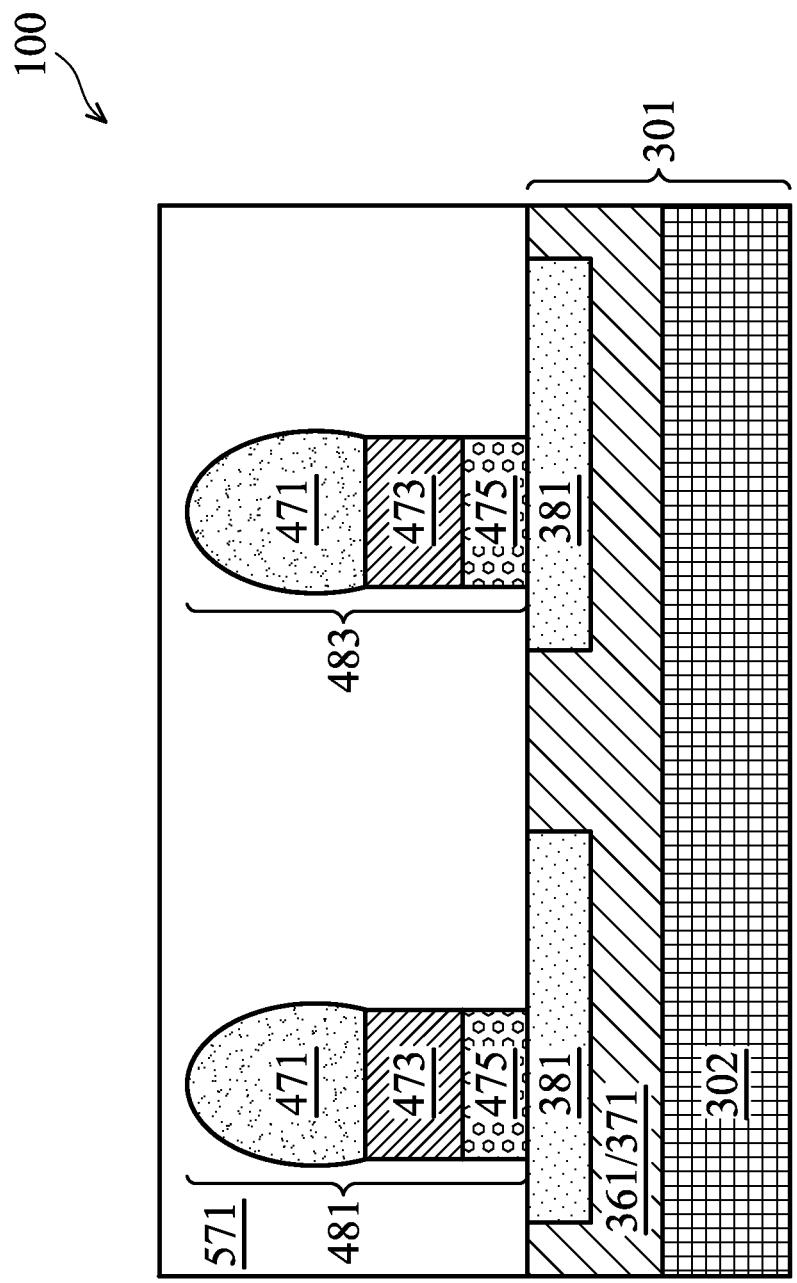

A simplified view of the package 100 in FIG. 1(a) is shown in FIG. 1(c). As illustrated in FIG. 1(c), the package 100 may be formed on a device 301. The device 301 comprises a substrate 302, an insulator layer 361/371 which represents the insulator layers 361 and 371 in FIG. 1(a), and a redistribution layer (RDL) 381 within the insulator layer. Micro-bump lines 481 and 483 may be formed above the device 301 and connected to the RDL 381 respectively. The micro-bump lines 481 and 483 and the connected RDLs are parts of an inductor 200 as shown in FIG. 1(b). An underfill 571 may cover the micro-bump lines 481 and 483. There may be a die placed above the device 301 and above the underfill 571, connected to micro-bumps by connectors, which are not shown in FIG. 1(c).

Figure 1D:
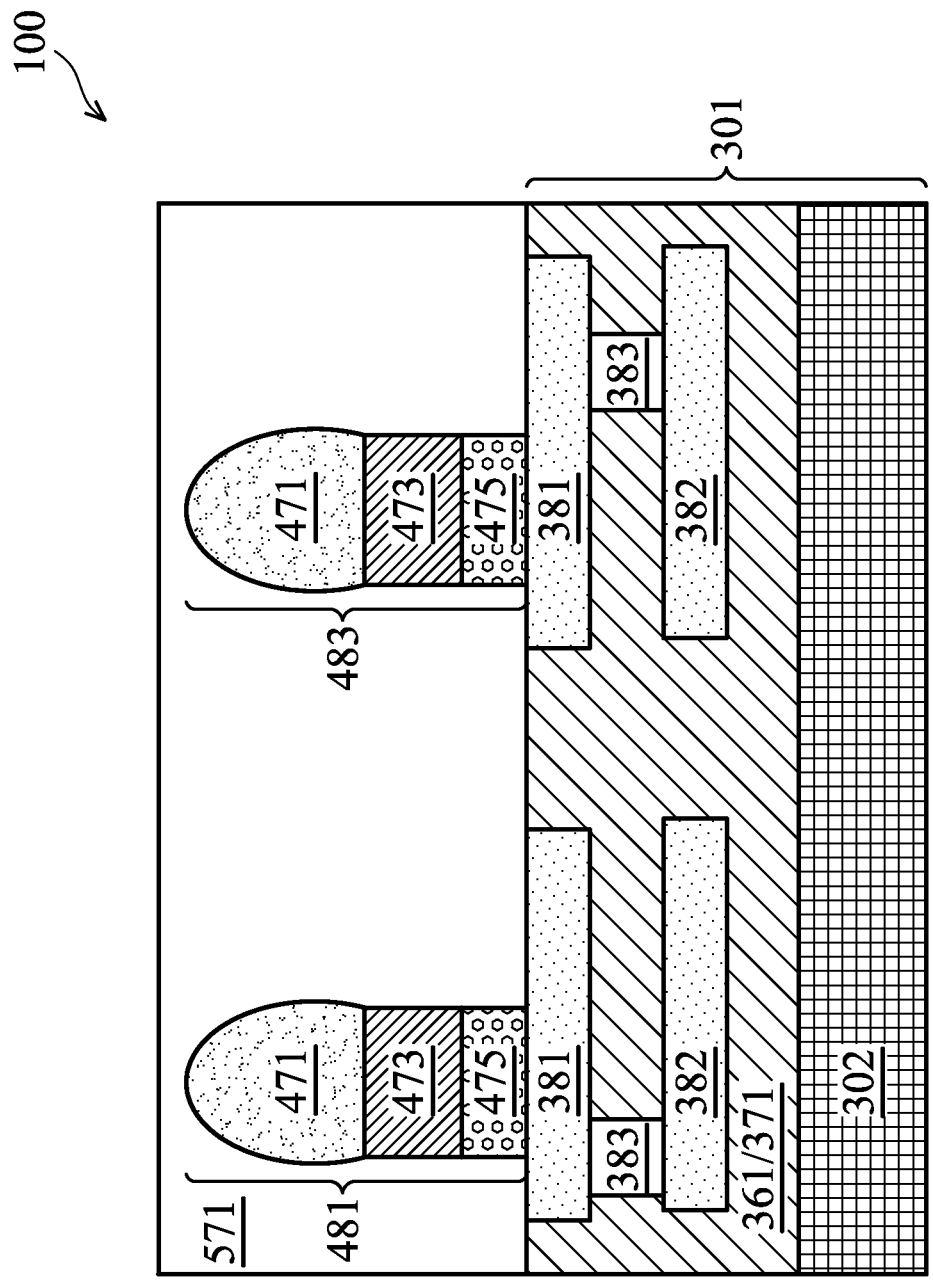

Another embodiment of the inductor 200 shown in FIG. 1(b) is shown in FIG. 1(d) in a similar fashion. As illustrated in FIG. 1(d), the package 100 may be formed on a device 301. The device 301 comprises a substrate 302 and an insulator layer 361/371. The device 301 further comprises a first RDL 381 and a second RDL 382 within the insulator layer, connected by vias 383. Micro-bump lines 481 and 483 may be formed above the device 301 and connected to the RDL 381. The micro-bump lines 481 and 483 and the connected RDLs 381 and 383 are parts of an inductor 200 as shown in FIG. 1(b). An underfill 571 may cover the micro-bump lines 481 and 483. There may be a die placed above the device 301 and above the underfill 571, connected to micro-bumps by connectors, which are not shown in FIG. 1(d).

FIGS. 2(a)-2(f) illustrate cross-sectional views and top views of inductors formed within a package using a micro-bump layer, in accordance with some additional embodiments. For embodiments shown in FIGS. 2(a)-2(f), the inductor comprises micro-bump lines connected to a RDL at the bottom device as well as to a RDL within a top device above the micro-bump layer, while the inductors shown in FIGS. 1(a)-1(d) comprises micro-bump lines connected to RDLs at the bottom device only.

Figure 2A:
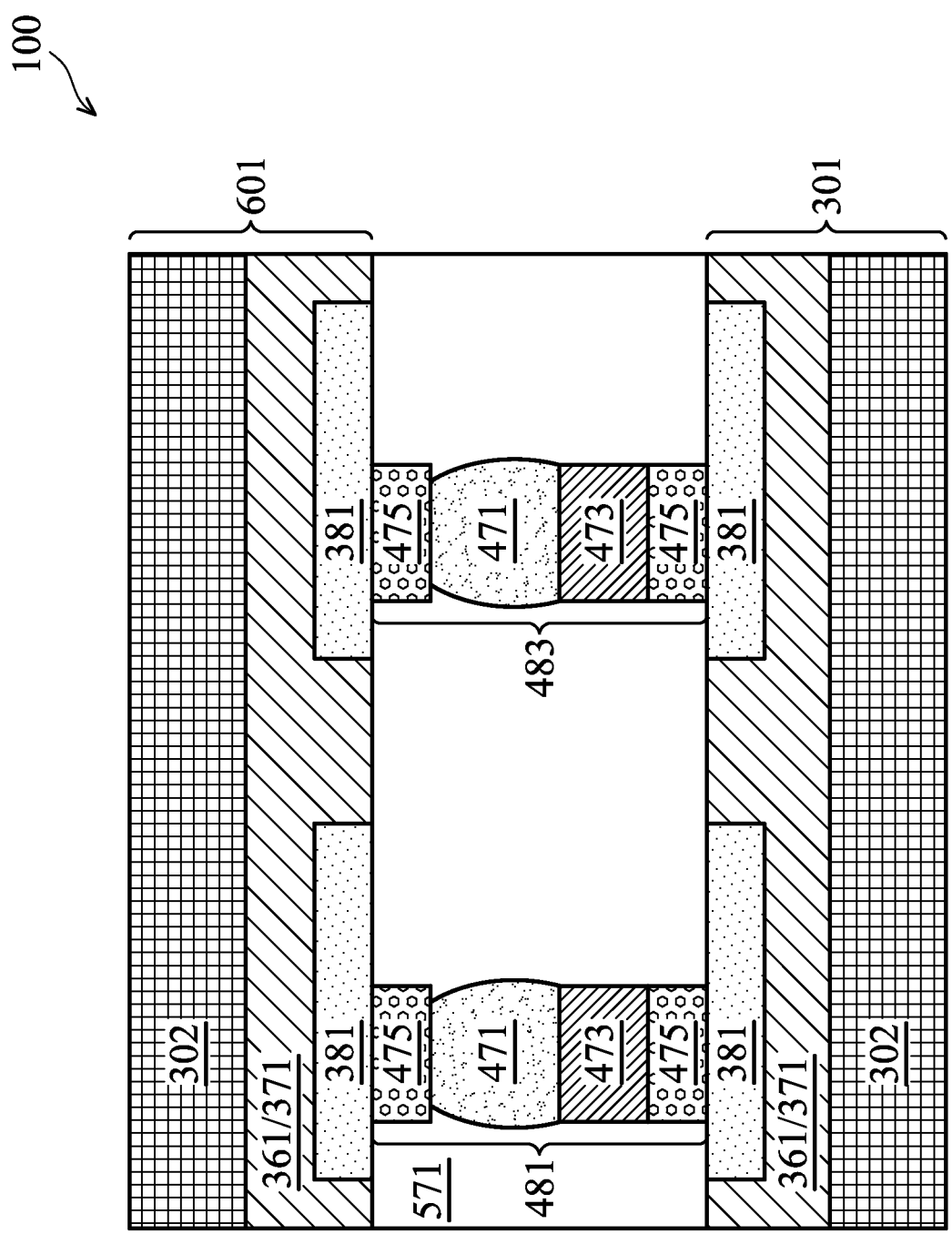
FIGS. 2(a)-2(f) illustrate cross-sectional views and top views of inductors formed within a package using a micro-bump layer, in accordance with some additional embodiments.

As illustrated in FIG. 2(a), the package 100 may be formed on a first device 301, which may be a bottom device. The device 301 comprises a substrate 302 and an insulator layer 361/371. The device 301 further comprises a first RDL 381 within the insulator layer. A micro-bump layer comprising micro-bump lines 481 and 483 may be formed above the first device 301. A second device 601, which may be a top device, may be formed above the micro-bump lines 481 and 483. The device 601 may also comprise a substrate 302, an insulator layer 361/371, and a second RDL 381 within the insulator layer. An underfill 571 may cover the micro-bump lines 481 and 483.

The micro-bump lines 481 and 483 are connected to the first RDL 381 within the first device 301 and the second RDL 381 within the second device 601. The micro-bump lines 481 and 483, the first RDL 381, and the second RDL 381 are parts of an inductor 200 as shown in FIG. 1(b). The micro-bump lines 481 and 483 may comprise multiple layers: the layer 475 may be a layer of Cu connected to the first RDL 381 within the device 301, another layer 475 may be a layer of Cu connected to the second RDL 381 within the device 601, the layer 473 next to the layer 475 may be a layer of Ni, and the layer 471 next to the layer 473 may be a layer of lead free solder such as SnAg. The height of the micro-bump layer may be defined by the height of the micro-bump lines 481 and 483, which may depend on the technology used in the package. For example, for current technology, the height of the micro-bump layer may be within the range of about 10 µm to about 50 µm, such as about 27 µm.

The device 301 may be an interposer, a part of a chip or an integrated circuit (IC) die, which may be the back or front side of a die, or a package substrate. Similarly, the device 601 may be an interposer, a part of a chip or an integrated circuit (IC) die, which may be the back or front side of a die, or a package substrate. These devices and any other suitable devices may alternatively be used and are fully intended to be included within the scope of the present embodiments.

Figure 2B:
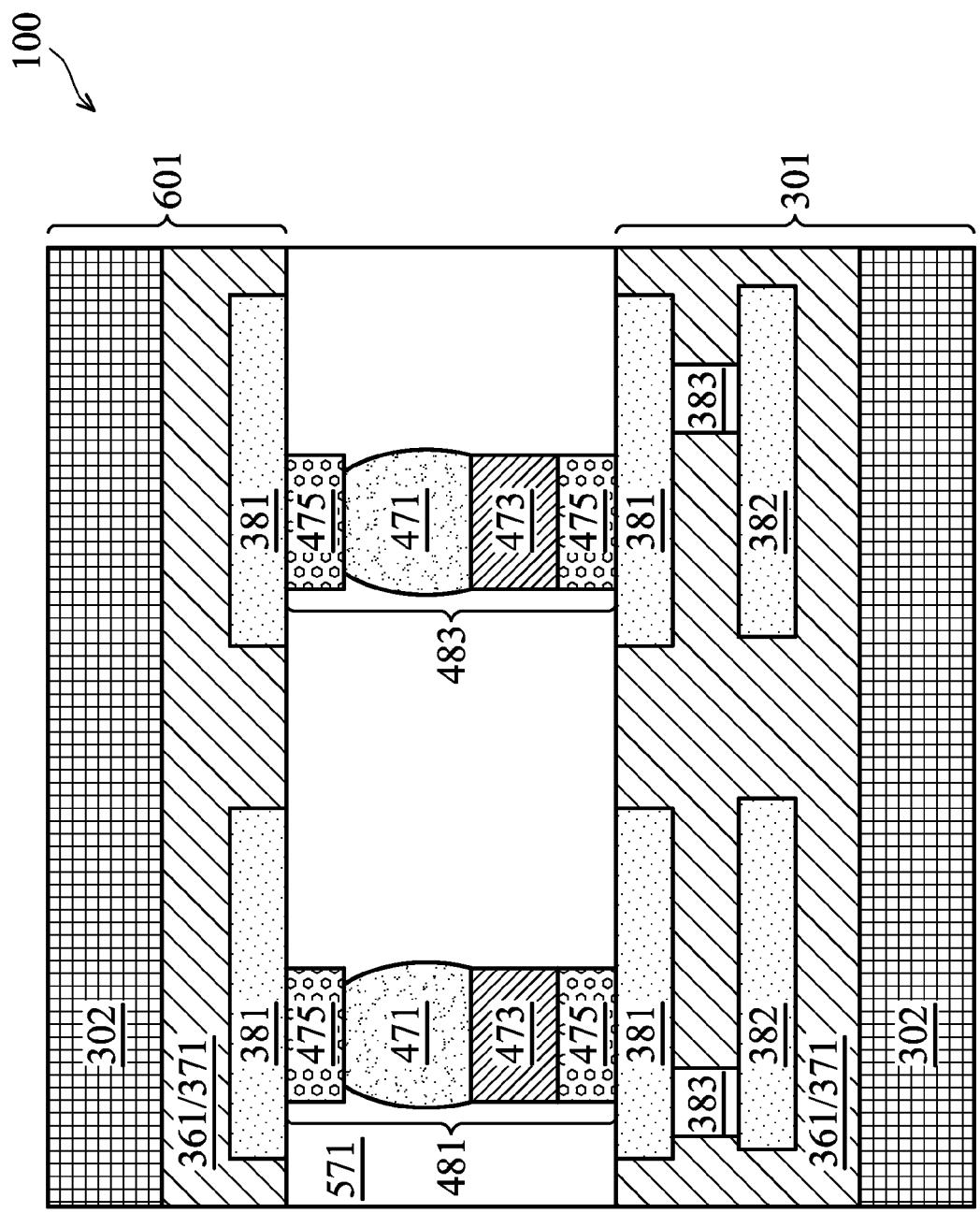

Another embodiment is shown in FIG. 2(b). As illustrated in FIG. 2(b), the package 100 may be formed on a first device 301, which may be a bottom device. The device 301 comprises a substrate 302 and an insulator layer 361/371.

The device 301 further comprises a first RDL 381 and a second RDL 382 within the insulator layer, connected by vias 383. A micro-bump layer comprises micro-bump lines 481 and 483 may be formed above the first device 301. A second device 601 may be formed above the micro-bump lines 481 and 483, which may be a top device. The device 601 may also comprise a substrate 302, an insulator layer 361/371, and a third RDL 381 within the insulator layer. An underfill 571 may cover the micro-bump lines 481 and 483.

The micro-bump lines 481 and 483 are connected to the first RDL 381 and the second RDL 382 within the first device 301 and the third RDL 381 within the second device 601. The micro-bump lines 481 and 483, the first RDL 381 and the second RDL 382 within the device 301, and third RDL 381 within the device 601 are parts of an inductor 200 as shown in FIG. 1(b). Other parts of the embodiment shown in FIG. 2(b) are similar to the corresponding components as described in FIG. 2(a) and FIG. 1(a).

Figure 2C:
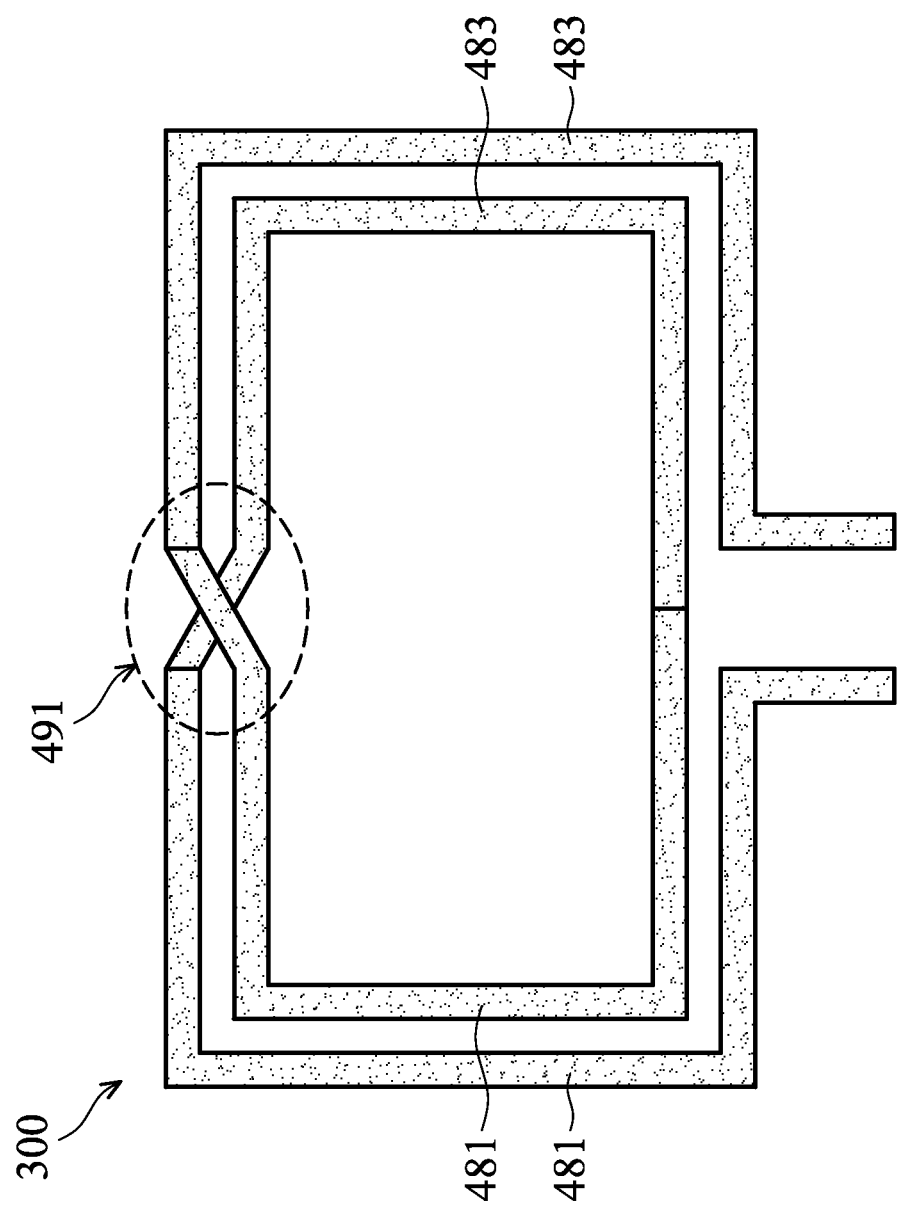
Figure 2D:
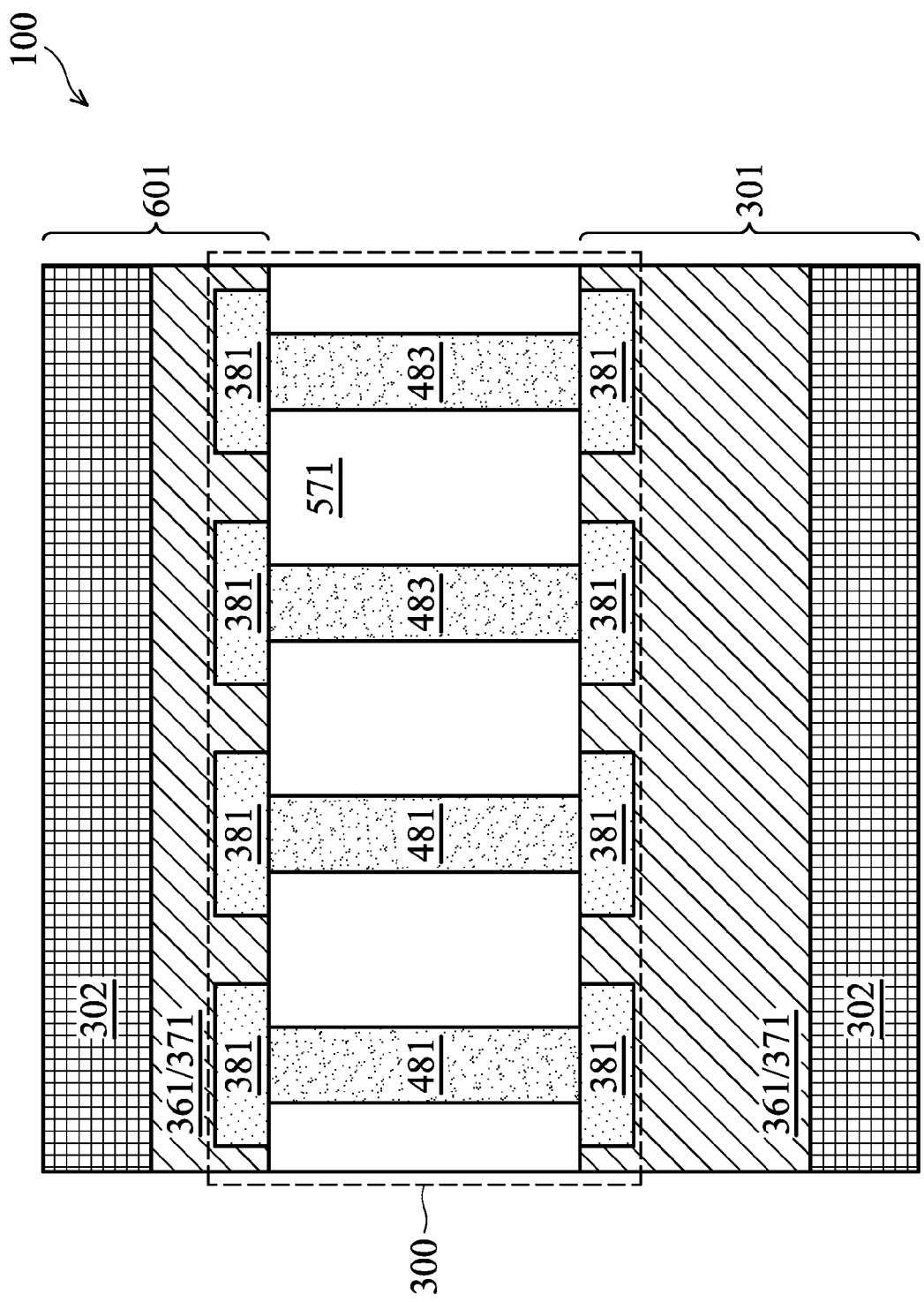

Besides the symmetric inductor 200 shown in FIG. 1(b), there are many other forms of inductors. A stacking spiral inductor 300 is shown in FIG. 2(c) in a top view. The symmetric spiral inductor 300 comprises of a first shunt winding 481 and a second shunt winding 483, and an area 491 represents a crossover region between the two shunt windings. A cross section view of the inductor 300 is shown in FIG. 2(d) within the package 100. The two micro-bump lines 481 represent the first shunt winding 481 of FIG. 2(c), and the two micro-bump lines 483 represent the second shunt winding 483 of FIG. 2(c). The micro-bump lines 481 and 483 are connected to the first RDL 381 within the first device 301 and the second RDL 381 within the second device 601. The micro-bump lines 481 and 483, the first RDL 381, and the second RDL 381 are parts of an inductor 300 as shown in FIG. 2(c). Other parts of the embodiment shown in FIG. 2(d) are similar to the corresponding components as described in FIG. 2(a) and FIG. 1(a).

Figure 2E:
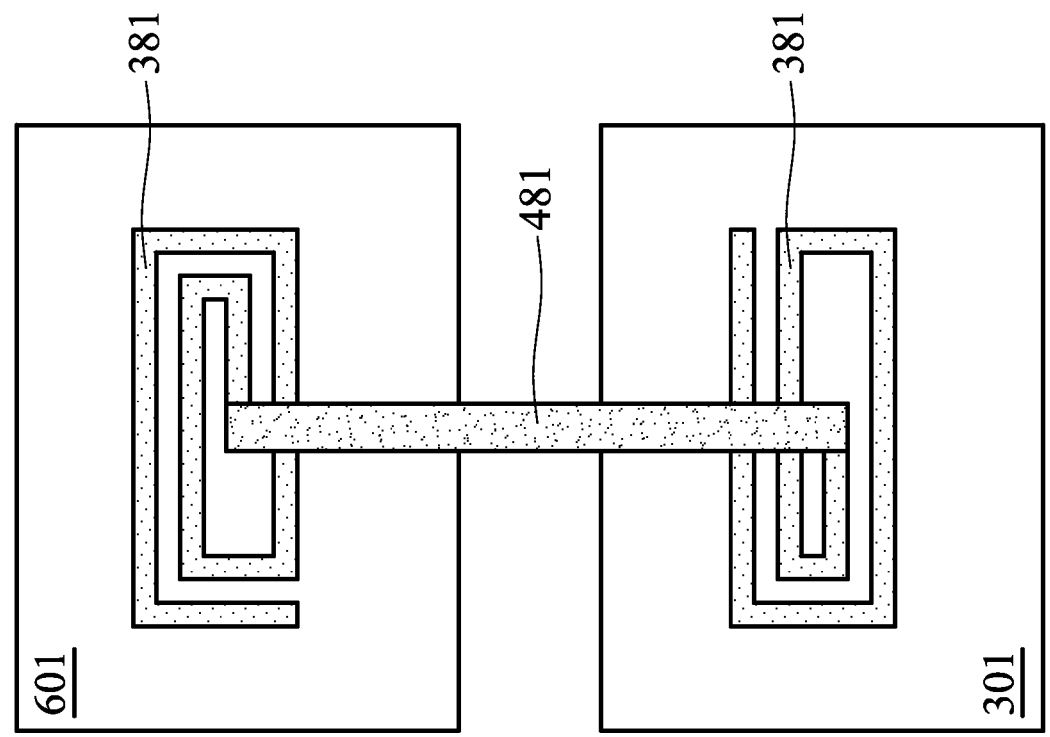

Alternatively, a vertical helical inductor 400 is shown in FIG. 2(e) in a top view. The helical inductor 400 comprises a micro-bump line 481 as a vertical connector connecting a first RDL 381 within the first device 301 and a second RDL 381 within the second device 601. The first RDL 381 and the second RDL 381 are made of multi-turn units. The first RDL 381 and the second RDL 381 may be formed in one RDL, or in multiple RDL segments within the devices and connected by vias between layers, which are not shown in FIG. 2(e). The micro-bump line 481, the first RDL 381, and the second RDL 381 are parts of the inductor 400.

Figure 2F:
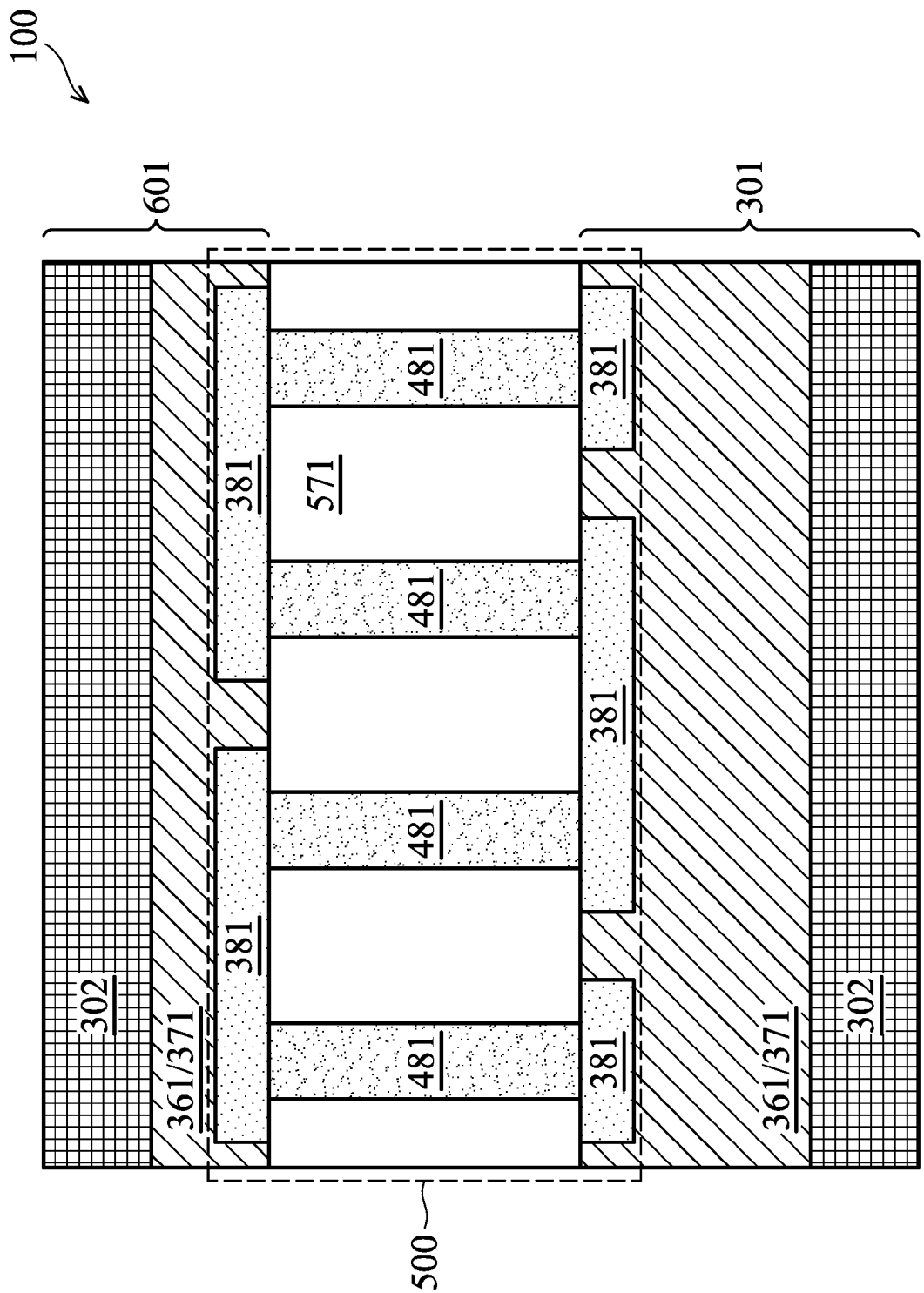

Alternatively, a meander inductor 500 is shown in FIG. 2(f) in a cross section view. The meander inductor 500 comprises of vertical segments made of micro-bump lines 481 and horizontal segments made of RDLs 381 within the bottom device 301 and the top device 601, connected together to form a sinusoid-like meander inductor 500. Alternatively, there may be multiple RDLs within the devices 301 and 601 connected by vias between layers, which are not shown in FIG. 2(f). Other parts of the embodiment shown in FIG. 2(f) are similar to the corresponding components as described in FIG. 2(a) and FIG. 1(a).

Figure 3A:
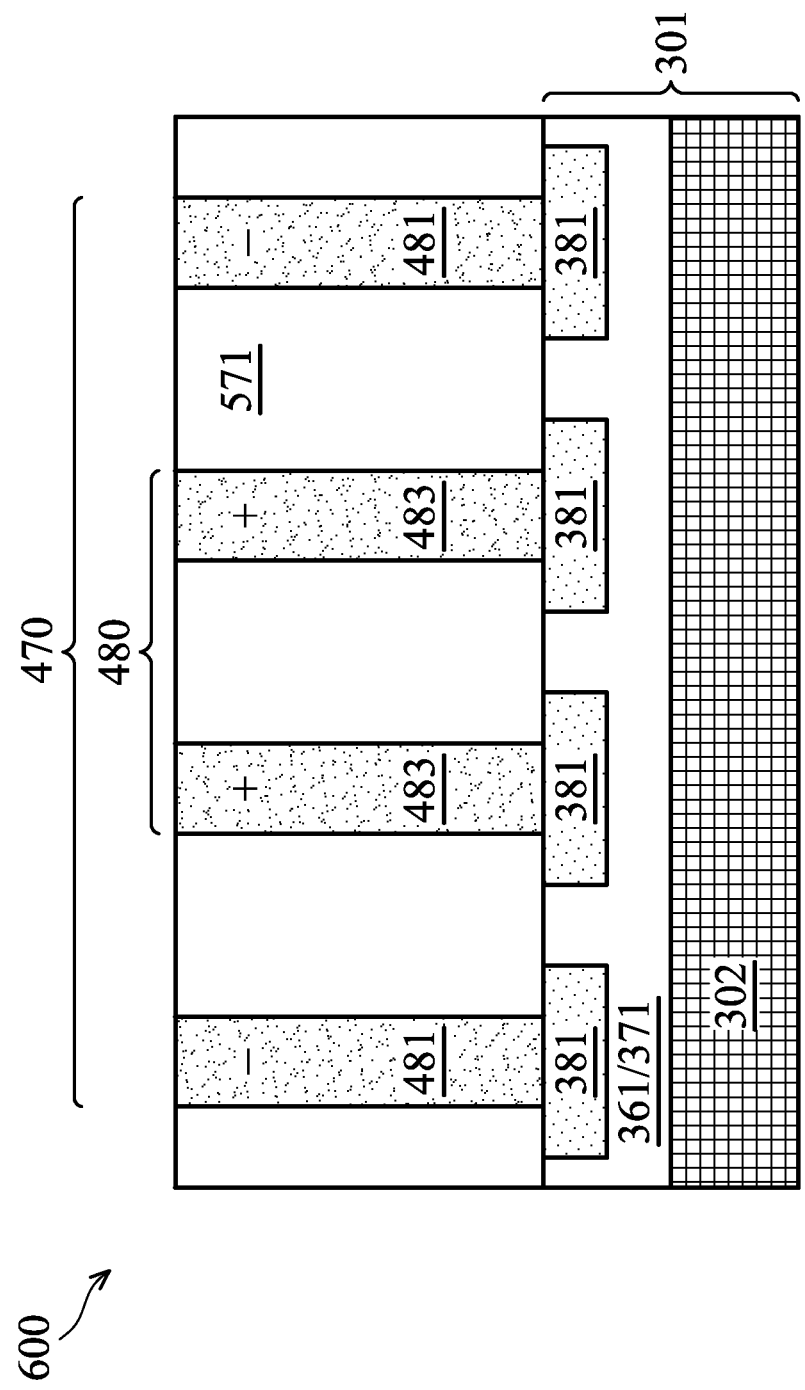
FIG. 3(a) illustrates a cross-sectional view of a transformer formed within a package using a micro-bump layer.
Figure 3B:
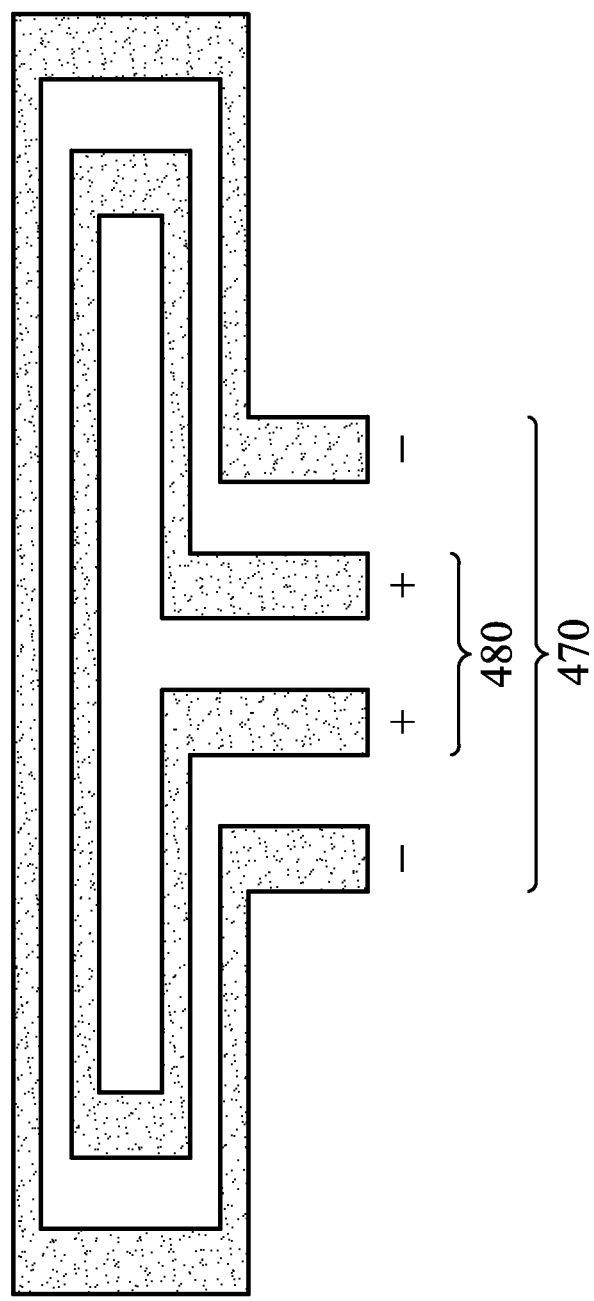
FIG. 3(b) illustrates a top view of a transformer formed within a package using a micro-bump layer, in accordance with some embodiments.
Figure 4:
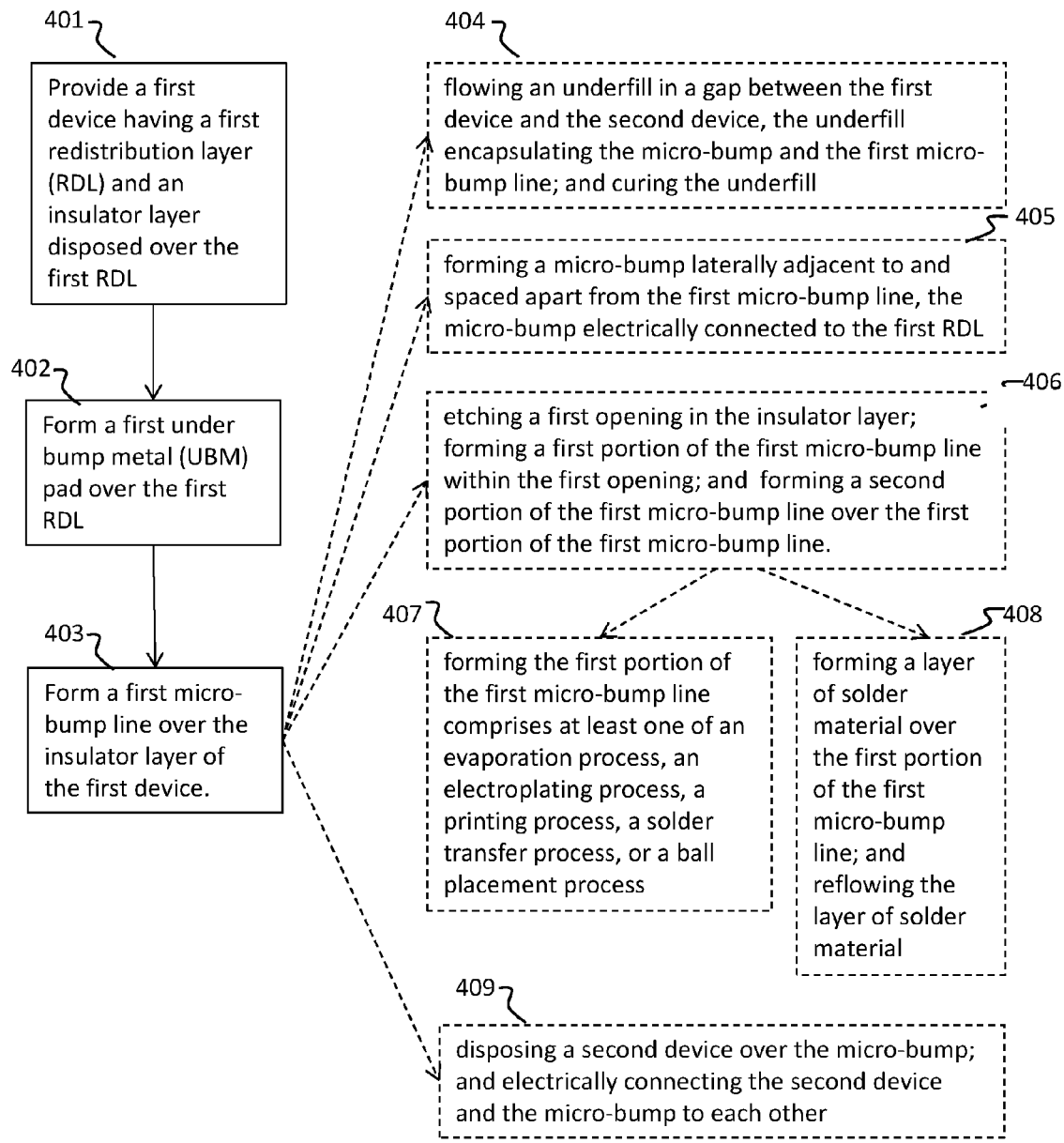
Figure 5:
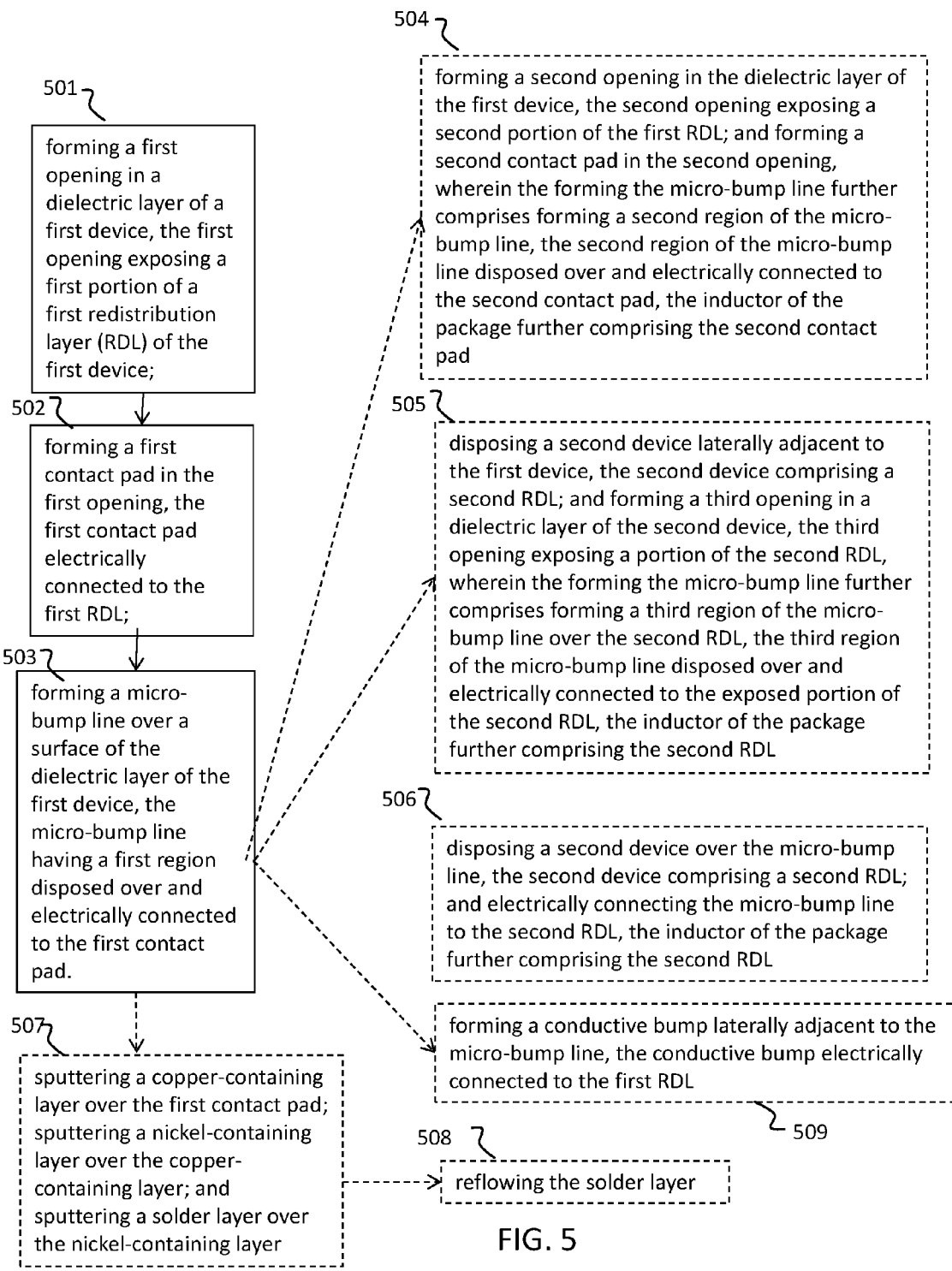
Figure 6:
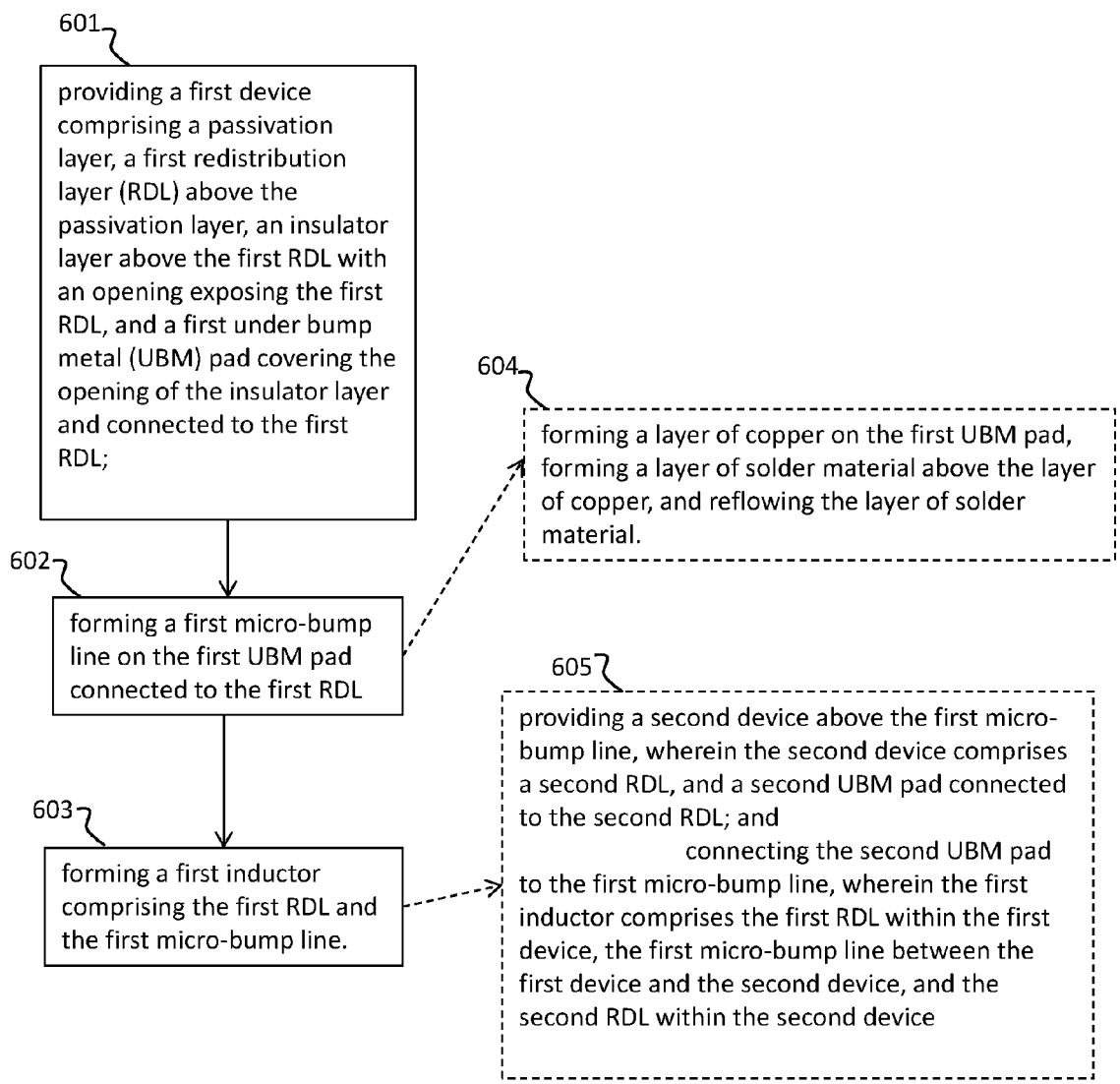

A transformer is a power converter that transfers electrical energy from one circuit to another. As illustrated in FIG. 3(a) in a cross-sectional view and in FIG. 3(b) in a top view, a transformer 600 is formed by a first inductor 470 and a second inductor 480. FIG. 3(b) illustrates a shape of the transformer 600 in a top view. The first inductor 470 comprises the micro-bump lines 481, and a second inductor 480 comprises the micro-bump lines 483. The micro-bump lines 481 and 483 are coupled to RDLs 381 within the bottom device 301. The bottom device 301 further comprises a substrate 302, and an insulator layer 361/371. The first inductor 470 may be coupled to the ground, marked as "−", which may be one terminal of a differential pair of two complementary signals, and the second inductor 480 may be coupled to a power source marked as "+", which may be another terminal of the differential pair. The two terminals with "−" and "+" could be out of phase, may be in a range from about 170 degree to about 190 degree, such as 180 degree. The first inductor 470 is physically separated from the second inductor 480 by dielectric material in a manner that promotes electromagnetic coupling between the two inductors. Even though only one turn of inductors 470 and 480 are shown in FIG. 3(b), the inductors 470 and 480 may comprise multiple turns.

The transformer 600 shown in FIGS. 3(a) and 3(b) is merely an example, where FIG. 3(b) illustrates one of the possible shapes of the transformer 600. There may be many other variations formed. For example, there may be multiple RDLs within the device 301 connected to the inductors 470 and 480. There may be a second device on top of the micro-bump lines 481 and 483 and RDLs of the second device may be part of the inductors, just as shown in FIGS. 2(a)-2(f). The inductors may be any kind of inductors such as symmetric inductors, spiral inductors, helical inductors, and meander inductors.

FIG. 4 illustrates a process flow of a method of manufacturing a package in accordance with some embodiments. Step 401 includes providing a first device having a first redistribution layer (RDL) and an insulator layer disposed over the first RDL. Step 402 includes forming a first under bump metal (UBM) pad over the first RDL. Step 403 includes forming a first micro-bump line over the insulator layer of the first device. Step 404 includes flowing an underfill in a gap between the first device and the second device, the underfill encapsulating the micro-bump and the first micro-bump line, and curing the underfill. Step 405 includes forming a micro-bump laterally adjacent to and spaced apart from the first micro-bump line, the micro-bump electrically connected to the first RDL. Step 406 includes etching a first opening in the insulator layer, forming a first portion of the first micro-bump line within the first opening, and forming a second portion of the first micro-bump line over the first portion of the first micro-bump line. Step 407 includes forming the first portion of the first micro-bump line comprises at least one of an evaporation process, an electroplating process, a printing process, a solder transfer process, or a ball placement process. Step 408 includes forming a layer of solder material over the first portion of the first micro-bump line and reflowing the layer of solder material. Step 409 includes disposing a second device over the micro-bump, and electrically connecting the second device and the micro-bump to each other.

FIG. 5 illustrates a process flow of a method of manufacturing a package in accordance with some embodiments. Step 501 includes forming a first opening in a dielectric layer of a first device, the first opening exposing a first portion of a first redistribution layer (RDL) of the first device. Step 502 includes forming a first contact pad in the first opening, the first contact pad electrically connected to the first RDL. Step 503 includes forming a micro-bump line over a surface of the dielectric layer of the first device, the micro-bump line having a first region disposed over and electrically connected to the first contact pad. Step 504 includes forming a second opening in the dielectric layer of the first device, the second opening exposing a second portion of the first RDL;

and forming a second contact pad in the second opening, wherein the forming the micro-bump line further comprises forming a second region of the micro-bump line, the second region of the micro-bump line disposed over and electrically connected to the second contact pad, the inductor of the package further comprising the second contact pad. Step 505 includes disposing a second device laterally adjacent to the first device, the second device comprising a second RDL; and forming a third opening in a dielectric layer of the second device, the third opening exposing a portion of the second RDL, wherein the forming the micro-bump line further comprises forming a third region of the micro-bump line over the second RDL, the third region of the micro-bump line disposed over and electrically connected to the exposed portion of the second RDL, the inductor of the package further comprising the second RDL. Step 506 includes disposing a second device over the micro-bump line, the second device comprising a second RDL; and electrically connecting the micro-bump line to the second RDL, the inductor of the package further comprising the second RDL. Step 507 includes sputtering a copper-containing layer over the first contact pad; sputtering a nickel-containing layer over the copper-containing layer; and sputtering a solder layer over the nickel-containing layer. Step 508 includes reflowing the solder layer. Step 509 includes forming a conductive bump laterally adjacent to the micro-bump line, the conductive bump electrically connected to the first RDL.

FIG. 6 illustrates a process flow of a method of manufacturing a package in accordance with some embodiments. Step 601 includes providing a first device comprising a passivation layer, a first redistribution layer (RDL) above the passivation layer, an insulator layer above the first RDL with an opening exposing the first RDL, and a first under bump metal (UBM) pad covering the opening of the insulator layer and connected to the first RDL. Step 602 includes forming a first micro-bump line on the first UBM pad connected to the first RDL. Step 603 includes forming a first inductor comprising the first RDL and the first micro-bump line. Step 604 includes forming a layer of copper on the first UBM pad, forming a layer of solder material above the layer of copper, and reflowing the layer of solder material. Step 605 includes providing a second device above the first micro-bump line, wherein the second device comprises a second RDL, and a second UBM pad connected to the second RDL, and connecting the second UBM pad to the first micro-bump line, wherein the first inductor comprises the first RDL within the first device, the first micro-bump line between the first device and the second device, and the second RDL within the second device.

A package comprising an inductor is disclosed. The package may comprise a first device and a micro-bump layer above the first device. The first device comprises a first redistribution layer (RDL). The micro-bump layer comprises a first micro-bump line connected to the first RDL. The inductor comprises the first RDL and the first micro-bump line. The first micro-bump line may be on an under bump metal (UBM) pad, which is connected to the first RDL. The first device may further comprise a passivation layer below the first RDL, and an insulator layer above the first RDL and exposing the first RDL to be connected to the UBM pad.

A method of forming a package containing an inductor is disclosed. The method comprises: providing a first device comprising a passivation layer, a first redistribution layer (RDL) above the passivation layer, an insulator layer above the first RDL with an opening exposing the first RDL, and a first under bump metal (UBM) pad covering the opening of the insulator layer and connected to the first RDL; forming a first micro-bump line on the first UBM pad connected to the first RDL; and forming an inductor comprising the first RDL and the first micro-bump line.

A package comprising an inductor is disclosed. The package may comprise a first device, a micro-bump layer above the first device, and a second device above the micro-bump layer. The first device comprises a first redistribution layer (RDL). The micro-bump layer comprises a first micro-bump line connected to the first RDL. The second device comprises a second RDL connected to the first micro-bump line. The inductor comprises the first RDL, the first micro-bump line, and the second RDL.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of manufacturing a package, the method comprising:
    providing a first device having a first redistribution layer (RDL) and an insulator layer disposed over the first RDL;
    forming a first under bump metal (UBM) pad over the first RDL, the first UBM pad extending through the insulator layer to be electrically coupled to the first RDL; and
    forming a first micro-bump line over and electrically coupled to the first UBM pad, the first micro-bump line having a first metal layer and a solder layer over the first metal layer, the first RDL and the first micro-bump line are part of a first inductor, the solder layer forming a loop of a coil of the first inductor.

2. The method of claim 1, wherein the forming the first UBM pad over the first RDL and the forming the first micro-bump line over the insulator layer comprises:
    etching a first opening in the insulator layer, the first opening exposing a portion of the first RDL;
    forming the first UBM pad within the first opening;
    forming the first metal layer of the first micro-bump line over the first UBM pad; and
    forming the solder layer of the first micro-bump line over the first metal layer of the first micro-bump line.

3. The method of claim 2, wherein the forming the first metal layer of the first micro-bump line comprises at least one of an evaporation process, an electroplating process, a printing process, a solder transfer process, or a ball placement process.

4. The method of claim 2, wherein the first metal layer of the first micro-bump line comprises copper.

5. The method of claim 2, wherein the forming the solder layer of the first micro-bump line comprises:
forming a layer of solder material over the first metal layer of the first micro-bump line; and
reflowing the layer of solder material.

6. The method of claim 1, further comprising:
forming a micro-bump laterally adjacent to and spaced apart from the first micro-bump line, the micro-bump electrically connected to the first RDL.

7. The method of claim 6, further comprising:
disposing a second device over the micro-bump; and
electrically connecting the second device and the micro-bump to each other.

8. The method of claim 7, further comprising:
flowing an underfill in a gap between the first device and the second device, the underfill encapsulating the micro-bump and the first micro-bump line; and
curing the underfill.

9. A method of manufacturing a package, the method comprising:
forming a first opening in a dielectric layer of a first device, the first opening exposing a first portion of a first redistribution layer (RDL) of the first device;
forming a first contact pad in the first opening, the first contact pad electrically connected to the first RDL; and
forming a micro-bump line extending laterally over a surface of the dielectric layer of the first device, the micro-bump line having a first region disposed over and electrically connected to the first contact pad, wherein the micro-bump line, the first contact pad, and the first RDL are parts of an inductor, wherein the forming the micro-bump line comprises:
forming a first metal layer over the first contact pad; and
forming a solder layer over the first metal layer, the solder layer forming a loop of a coil of the inductor.

10. The method of claim 9, further comprising:
forming a second opening in the dielectric layer of the first device, the second opening exposing a second portion of the first RDL; and
forming a second contact pad in the second opening, wherein the forming the micro-bump line further comprises forming a second region of the micro-bump line, the second region of the micro-bump line disposed over and electrically connected to the second contact pad, the inductor of the package further comprising the second contact pad.

11. The method of claim 9, further comprising:
disposing a second device laterally adjacent to the first device, the second device comprising a second RDL; and
forming a third opening in a dielectric layer of the second device, the third opening exposing a portion of the second RDL, wherein the forming the micro-bump line further comprises forming a third region of the micro-bump line over the second RDL, the third region of the micro-bump line disposed over and electrically connected to the exposed portion of the second RDL, the inductor of the package further comprising the second RDL.

12. The method of claim 9, further comprising:
disposing a second device over the micro-bump line, the second device comprising a second RDL; and
electrically connecting the micro-bump line to the second RDL, the inductor of the package further comprising the second RDL.

13. The method of claim 12, further comprising:
flowing an underfill in a gap between the first device and the second device, the underfill encapsulating the micro-bump line; and
curing the underfill.

14. The method of claim 9, wherein the forming the micro-bump line comprises:
sputtering a copper-containing layer over the first contact pad to form the first metal layer;
sputtering a nickel-containing layer over the copper-containing layer; and
sputtering the solder layer over the nickel-containing layer.

15. The method of claim 14, further comprising:
reflowing the solder layer.

16. The method of claim 9, further comprising:
forming a conductive bump laterally adjacent to the micro-bump line, the conductive bump electrically connected to the first RDL.

17. The method of claim 16, wherein the forming the conductive bump comprises a controlled collapse chip connection new process.

18. A method of manufacturing a package, the method comprising:
providing a first device comprising a passivation layer, a first redistribution layer (RDL) above the passivation layer, an insulator layer above the first RDL with an opening exposing the first RDL, and a first under bump metal (UBM) pad covering the opening of the insulator layer and connected to the first RDL;
forming a first micro-bump line on the first UBM pad connected to the first RDL, the first micro-bump line having a first portion extending in a first direction over the insulator layer and a second portion extending in a second direction over the insulator layer, the second direction being different than the first direction, wherein the forming the first micro-bump line comprises forming a layer of copper on the first UBM pad, forming a layer of solder material above the layer of copper, and reflowing the layer of solder material; and
forming a first inductor comprising the first RDL and the first micro-bump line, the layer of solder material of the first micro-bump line forming a loop of a coil of the first inductor.

19. The method of claim 18, further comprising:
providing a second device above the first micro-bump line, wherein the second device comprises a second RDL, and a second UBM pad connected to the second RDL; and
connecting the second UBM pad to the first micro-bump line, wherein the first inductor comprises the first RDL within the first device, the first micro-bump line between the first device and the second device, and the second RDL within the second device.

20. The method of claim 18, wherein the forming the first micro-bump line comprises:
sputtering the layer of copper over the first UBM pad;
sputtering a nickel-containing layer over the layer of copper; and
sputtering the layer of solder material over the nickel-containing layer.

* * * * *